US009257275B2

(12) United States Patent
Sano et al.

(10) Patent No.: US 9,257,275 B2
(45) Date of Patent: Feb. 9, 2016

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Atsushi Sano, Toyama (JP); Yoshiro Hirose, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 14/175,463

(22) Filed: Feb. 7, 2014

(65) Prior Publication Data

US 2014/0227886 A1 Aug. 14, 2014

(30) Foreign Application Priority Data

Feb. 13, 2013 (JP) ................... 2013-025382

(51) Int. Cl.
| | |
|---|---|
| *H01L 21/469* | (2006.01) |
| *H01L 21/02* | (2006.01) |
| *C23C 16/30* | (2006.01) |
| *C23C 16/455* | (2006.01) |
| *C23C 16/56* | (2006.01) |

(52) U.S. Cl.
CPC ............ *H01L 21/0228* (2013.01); *C23C 16/30* (2013.01); *C23C 16/45529* (2013.01); *C23C 16/45531* (2013.01); *C23C 16/45546* (2013.01); *C23C 16/56* (2013.01); *H01L 21/02167* (2013.01); *H01L 21/02274* (2013.01)

(58) Field of Classification Search
None
See application file for complete search history.

(56) References Cited

U.S. PATENT DOCUMENTS

| | | | |
|---|---|---|---|
| 7,351,668 B2 * | 4/2008 | Chou | ............... C23C 16/36 257/E21.101 |
| 2008/0063791 A1 | 3/2008 | Hasebe et al. | |
| 2010/0130024 A1 * | 5/2010 | Takasawa | ......... C23C 16/45531 438/761 |
| 2011/0294280 A1 | 12/2011 | Takasawa et al. | |
| 2013/0052836 A1 | 2/2013 | Hirose et al. | |

FOREIGN PATENT DOCUMENTS

| | | |
|---|---|---|
| JP | 2008-060455 A | 3/2008 |
| JP | 2010-153795 A | 7/2010 |
| JP | 2010-251654 A | 11/2010 |
| JP | 2011-249480 A | 12/2011 |
| WO | 2011/125395 A1 | 10/2011 |

* cited by examiner

*Primary Examiner* — Benjamin Sandvik
*Assistant Examiner* — Herve Assouman
(74) *Attorney, Agent, or Firm* — Volpe and Koenig, P.C.

(57) ABSTRACT

A method of manufacturing a semiconductor device is disclosed. The method includes forming a thin film containing a predetermined element, boron, carbon, and nitrogen on a substrate by performing a cycle a predetermined number of times. The cycle includes forming a first layer containing boron and a halogen group by supplying a first precursor gas containing boron and the halogen group to the substrate; and forming a second layer containing the predetermined element, boron, carbon, and nitrogen by supplying a second precursor gas containing the predetermined element and an amino group to the substrate and modifying the first layer.

12 Claims, 15 Drawing Sheets

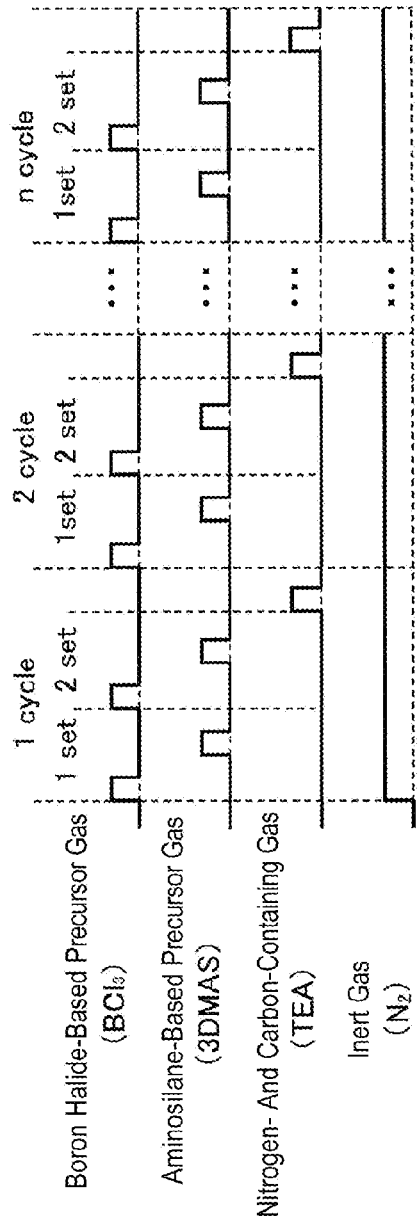
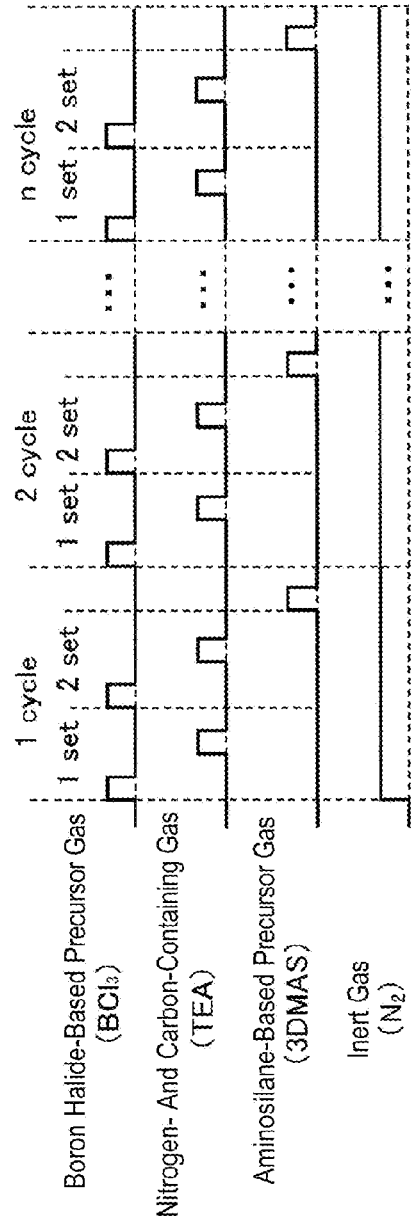

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2013-025382, filed on Feb. 13, 2013, the entire contents of which are incorporated herein by reference.

TECHNICAL FIELD

The present disclosure relates to a method of manufacturing a semiconductor device, a substrate processing apparatus, and a recording medium, which include, perform, or operate a process of forming a thin film on a substrate.

BACKGROUND

As sizes of transistors are reduced, a thin film such as an insulating film constituting a sidewall spacer (SWS) of a gate electrode requires a low temperature for film forming, an improved resistance to hydrogen fluoride (HF), and a low dielectric constant. Thus, it is researched to employ as the insulating film a silicon boronitride film (SiBN film) in which boron (B) is added to a silicon nitride film (SiN film) or a silicon borocarbonitride film (SiBCN film) in which carbon (C) is also added.

Since such an insulating film as described above requires high step coverage properties, it may be often formed by an alternate supply method of alternately supplying different kinds of processing gases. For example, dichlorosilane ($SiH_2Cl_2$) gas or the like which is a silicon-containing gas as a silicon source, boron trichloride ($BCl_3$) gas, diborane ($B_2H_6$) gas or the like as a boron source, ammonia ($NH_3$) gas or the like as a nitrogen source, and ethylene ($C_2H_4$) gas, propylene ($C_3H_6$) gas or the like as a carbon source may be used so that a cycle of sequentially supplying those processing gases to a substrate is performed a predetermined number of times so as to form a SiBN or SiBCN film on the substrate. However, in the above method separately supplying the silicon source, the boron source, the nitrogen source, and the carbon source, the productivity for film forming may be deteriorated due to an extended time required for each cycle.

SUMMARY

The present disclosure provides some embodiments of a method of manufacturing a semiconductor device, a substrate processing apparatus, and a recording medium, which form a thin film having a high resistance to HF and a low dielectric constant in a low temperature range while achieving high productivity.

According to one embodiment of the present disclosure, there is provided a method of manufacturing a semiconductor device, including forming a thin film containing a predetermined element, boron, carbon, and nitrogen on a substrate by performing a cycle a predetermined number of times, the cycle including forming a first layer containing boron and a halogen group by supplying a first precursor gas containing boron and the halogen group to the substrate; and forming a second layer containing the predetermined element, boron, carbon, and nitrogen by supplying a second precursor gas containing the predetermined element and an amino group to the substrate and modifying the first layer.

According to another embodiment of the present disclosure, provided is a substrate processing apparatus, including a process chamber in which processing to a substrate is performed; a first precursor gas supply system configured to supply a first precursor gas containing boron and a halogen group into the process chamber; a second precursor gas supply system configured to supply a second precursor gas containing a predetermined element and an amino group into the process chamber; a control part configured to control the first precursor gas supply system and the second precursor gas supply system such that a thin film containing the predetermined element, boron, carbon, and nitrogen is formed on the substrate in the process chamber by performing a cycle a predetermined number of times, wherein the cycle includes forming a first layer containing boron and the halogen group by supplying the first precursor gas to the substrate; and forming a second layer containing the predetermined element, boron, carbon, and nitrogen by supplying the second precursor gas to the substrate and modifying the first layer.

According to still another embodiment of the present disclosure, provided is a non-transitory computer-readable recording medium storing a program that causes a computer to perform a process of forming a thin film containing a predetermined element, boron, carbon, and nitrogen on a substrate in a process chamber by performing a cycle a predetermined number of times, the cycle including forming a first layer containing boron and a halogen group by supplying a first precursor gas containing boron and the halogen group to the substrate; and forming a second layer containing the predetermined element, boron, carbon, and nitrogen by supplying a second precursor gas containing the predetermined element and an amino group to the substrate and modifying the first layer.

BRIEF DESCRIPTION OF THE DRAWINGS

FIG. 1 schematically illustrates a configuration of a vertical processing furnace of a substrate processing apparatus appropriately employed in one embodiment of the present disclosure, in which a portion of the process furnace is shown by a longitudinal sectional view.

FIG. 2 schematically illustrates a configuration of the vertical processing furnace of the substrate processing apparatus appropriately employed in one embodiment of the present disclosure, in which a portion of the processing furnace is shown by a sectional view taken along a line A-A in FIG. 1.

FIG. 3 schematically illustrates a configuration of a controller in a substrate processing apparatus appropriately employed in one embodiment of the present disclosure, in which its control system is shown as a block diagram.

FIG. 4 illustrates a flowchart of film forming in a film forming sequence according to a first embodiment of the present disclosure.

FIG. 5A illustrates gas supply timings in the film forming sequence according to the first embodiment of the present disclosure.

FIG. 5B illustrates a modified example of gas supply timings in the film forming sequence according to the first embodiment of the present disclosure.

FIG. 5C illustrates another modified example of gas supply timings in the film forming sequence according to the first embodiment of the present disclosure.

FIG. 6 illustrates a flowchart of film forming in a first film forming sequence according to a second embodiment of the present disclosure.

FIG. 15A illustrates gas supply timings in the second film forming sequence according to the fourth embodiment of the present disclosure.

FIG. 15B illustrates a modified example of gas supply timings in the second film forming sequence according to the fourth embodiment of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present invention(s). However, it will be apparent to one of ordinary skill in the art that the present invention(s) may be practiced without these specific details. In other instances, well-known methods, procedures, systems, and components have not been described in detail so as not to unnecessarily obscure aspects of the various embodiments.

First Embodiment of the Present Disclosure

A first embodiment of the present disclosure is described below in detail with reference to the accompanying drawings.

(1) Configuration of Substrate Processing Apparatus

Figure 1:
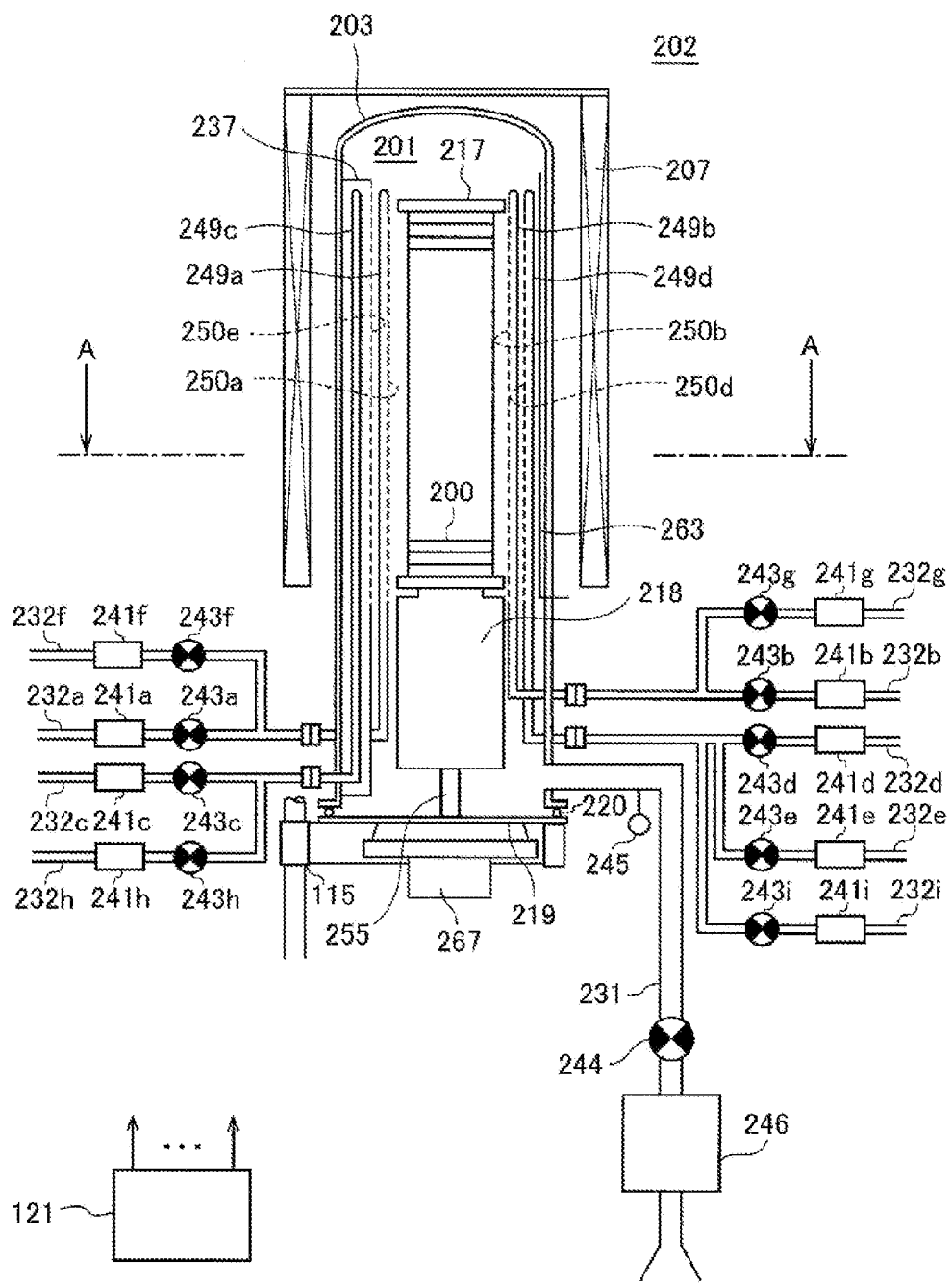
Figure 2:
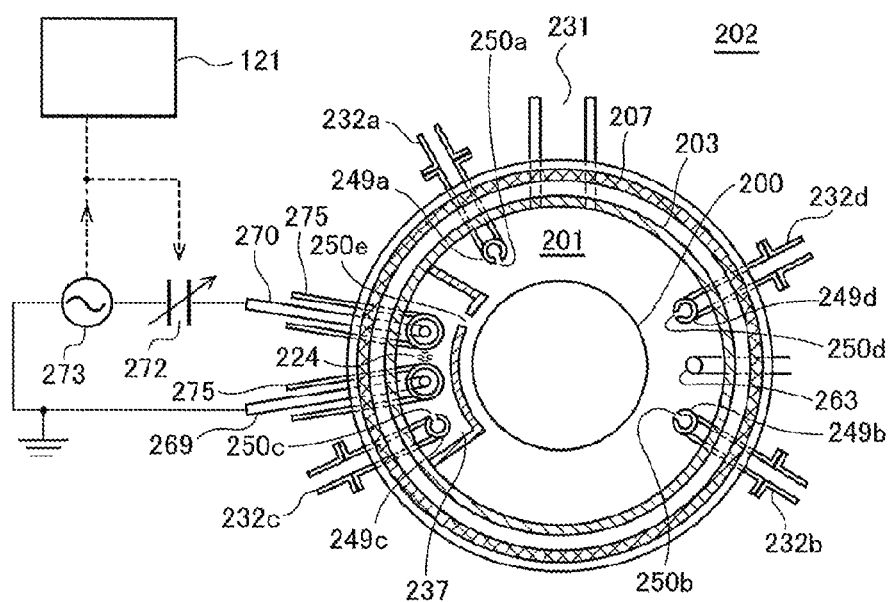

FIG. 1 schematically illustrates a configuration of a vertical processing furnace 202 of a substrate processing apparatus appropriately employed in one embodiment of the present disclosure, in which a portion of the processing furnace 202 is shown by a longitudinal sectional view. FIG. 2 schematically illustrates a configuration of the vertical processing furnace 202 of the substrate processing apparatus appropriately employed in one embodiment of the present disclosure, in which a portion of the processing furnace 202 is shown by a sectional view taken along a line A-A in FIG. 1.

As illustrated in FIG. 1, the processing furnace 202 includes a heater 207 serving as a heating unit (i.e., heating mechanism). The heater 207 is of a cylindrical shape and is supported by a heater base (not shown) serving as a support plate and is vertically installed. The heater 207 acts as an activating unit to activate gas by heat, which will be described later.

A reaction tube 203 constituting a reaction vessel (i.e., a process vessel) is installed inside the heater 207 to be concentric with the heater 207. The reaction tube 203 is made of a heat resistant material such as quartz (i.e., $SiO_2$) or silicon carbide (SiC) and has a cylindrical shape with its upper end closed and its lower end opened. A process chamber 201 is formed in a hollow cylindrical portion of the reaction tube 203. The process chamber 201 configured to accommodate a plurality of wafers 200 as substrates in such a state that the wafers 200 are horizontally stacked in multiple stages along a vertical direction by a boat 217 which will be described later.

A first nozzle 249a, a second nozzle 249b, a third nozzle 249c, and a fourth nozzle 249d penetrate through a lower portion of the reaction tube 203 to be installed in the process chamber 201. The first nozzle 249a, the second nozzle 249b, the third nozzle 249c, and the fourth nozzle 249d are connected to a first gas supply pipe 232a, a second gas supply pipe 232b, a third gas supply pipe 232c, and a fourth gas supply pipe 232d, respectively. A fifth gas supply pipe 232e is connected to the fourth gas supply pipe 232d. In this manner, the four nozzles 249a, 249b, 249c, and 249d and the five gas supply pipes 232a, 232b, 232c, 232d, and 232e are installed to the reaction tube 203 to supply different types of gases, in the example, five kinds of gases, into the process chamber 201.

In addition, a manifold (not shown) formed of metal that supports the reaction tube 203 may be installed under the reaction tube 203 such that the nozzles are configured to penetrate through a sidewall of the metal manifold. In this case, an exhaust pipe 231, which will be described later, may be further installed to the metal manifold. The exhaust pipe 231 may be installed to a lower portion of the reaction tube 203 rather than the metal manifold. In the manner as described, a furnace port of the processing furnace 202 may be formed of metal, and the nozzles may be installed in the metal furnace port.

A mass flow controller (MFC) 241a serving as a flow rate controller (i.e., a flow rate control part) and a valve 243a serving as an opening/closing valve are sequentially installed in the first gas supply pipe 232a from an upstream side. A first inert gas supply pipe 232f is connected to the first gas supply pipe 232a at a more downstream side of the valve 243a. A mass flow controller 241f serving as a flow rate controller (i.e., a flow rate control part) and a valve 243f serving as an opening/closing valve are sequentially installed in the first inert gas supply pipe 232f from an upstream side. In addition, the above-described first nozzle 249a is connected to an end portion of the first gas supply pipe 232a. The first nozzle 249a is installed in an arc-shaped space between an inner wall of the reaction tube 203 and the wafers 200 such that the first nozzle 249a extends upward in a stacked direction of the wafers 200 from a lower portion of the inner wall of the reaction tube 203 to an upper portion thereof. Specifically, the first nozzle 249a is installed along a wafer arrangement region where the wafers 200 are arranged, and in a region that horizontally surrounds the wafer arrangement region at a side of the wafer arrangement region. The first nozzle 249a is configured as an L-shaped nozzle, and its horizontal portion is installed to penetrate through a lower sidewall of the reaction tube 203 while its vertical portion is installed to ascend at least from one end portion to the other end portion of the wafer arrangement region. A gas supply hole 250a for supplying gas is installed at a side surface of the first nozzle 249a. The gas supply hole 250a is opened toward a center of the reaction tube 203 to allow the gas to be supplied to the wafers 200. A plurality of gas supply holes 250a is installed at a predetermined opening pitch from a lower portion to an upper portion of the reaction tube 203. Each of the gas supply holes 250a may have the same opening area. A first gas supply system mainly includes the first gas supply pipe 232a, the mass flow controller 241a, and the valve 243a. The first gas supply system may also include the first nozzle 249a. In addition, a first inert gas supply system mainly includes the first inert gas supply pipe 232f, the mass flow controller 241f, and the valve 243f. The first inert gas supply system may also serve as a purge gas supply system.

A mass flow controller (MFC) 241b serving as a flow rate controller (i.e., a flow rate control part) and a valve 243b serving as an opening/closing valve are sequentially installed in the second gas supply pipe 232b from an upstream side. In addition, a second inert gas supply pipe 232g is connected to the second gas supply pipe 232b at a more downstream side of the valve 243b. A mass flow controller 241g serving as a flow rate controller (i.e., a flow rate control part) and a valve 243g serving as an opening/closing valve are sequentially installed in the second inert gas supply pipe 232g from an upstream side. Further, the second nozzle 249b is connected to an end portion of the second gas supply pipe 232b. The second nozzle 249b is installed in an arc-shaped space between the inner wall of the reaction tube 203 and the wafers 200 such that the second nozzle 249b extends upward in the stacked direction of the wafers 200 from a lower portion of the inner wall of the reaction tube 203 to an upper portion thereof. Specifically, the second nozzle 249b is installed along the wafer arrangement region where the wafers 200 are arranged, and in a region that horizontally surrounds the wafer arrangement region at a side of the wafer arrangement region. The second nozzle 249b is configured as an L-shaped nozzle, and its horizontal portion is installed to penetrate through the lower sidewall of the reaction tube 203 while its vertical portion is installed to ascend from one end portion to the other end portion of the wafer arrangement region. A gas supply hole 250b for supplying gas is installed at a side surface of the second nozzle 249b. The gas supply hole 250b is opened toward the center of the reaction tube 203 to allow the gas to be supplied to the wafers 200. A plurality of gas supply holes 250b is installed at a predetermined opening pitch from a lower portion to an upper portion of the reaction tube 203. Each of the gas supply holes 250b may have the same opening area. A second gas supply system mainly includes the second gas supply pipe 232b, the mass flow controller 241b, and the valve 243b. The second gas supply system may also include the second nozzle 249b. In addition, a second inert gas supply system mainly includes the second inert gas supply pipe 232g, the mass flow controller 241g, and the valve 243g. The second inert gas supply system may also serve as a purge gas supply system.

A mass flow controller (MFC) 241c serving as a flow rate controller (i.e., a flow rate control part) and a valve 243c serving as an opening/closing valve are sequentially installed in the third gas supply pipe 232c from an upstream side. In addition, a third inert gas supply pipe 232h is connected to the third gas supply pipe 232c at a more downstream side of the valve 243c. A mass flow controller 241h serving as a flow rate controller (i.e., a flow rate control part) and a valve 243h serving as an opening/closing valve are sequentially installed in the third inert gas supply pipe 232h from an upstream side. Further, the third nozzle 249c is connected to an end portion of the third gas supply pipe 232c. The third nozzle 249c is installed inside a buffer chamber 237 that serves as a gas dispersion space.

The buffer chamber 237 is installed, along the stacked direction of the wafers 200, in the arc-shaped space between the inner wall of the reaction tube 203 and the wafers 200 and in a region spanning from a lower portion of the reaction tube 203 to an upper portion thereof. Thus, the buffer chamber 237 is installed along the wafer arrangement region, and in a region that horizontally surrounds the wafer arrangement region at a side of the wafer arrangement region. A gas supply hole 250e for supplying gas is installed at an end portion in a wall of the buffer chamber 237 adjacent to the wafers 200. The gas supply hole 250e is opened toward the center of the reaction tube 203 to allow the gas to be supplied to the wafers 200. A plurality of gas supply holes 250e is installed at a predetermined opening pitch from a lower portion to an upper portion of the reaction tube 203. Each of the gas supply holes 250e may have the same opening area.

The third nozzle 249c is installed in an end portion of the buffer chamber 237, which is opposite to the other end portion where the gas supply holes 250e are formed, to ascend upward in the stacked direction of the wafers 200 toward an upper portion from a lower portion of the inner wall of the reaction tube. Thus, the third nozzle 249c is installed along the wafer arrangement region where the wafers 200 are arranged, and in a region that horizontally surrounds the wafer arrangement region at a side of the wafer arrangement region. The third nozzle 249c is configured as an L-shaped nozzle, and its horizontal portion is installed to penetrate through the lower sidewall of the reaction tube 203 while its vertical portion installed is to ascend at least from one end portion to the other end portion of the wafer arrangement region. A gas supply hole 250c for supplying gas is installed at a side surface of the third nozzle 249c. The gas supply hole 250c is opened toward the center of the buffer chamber 237. Similar to the gas supply holes 250e of the buffer chamber 237, a plurality of gas supply holes 250c is installed at a predetermined opening pitch from a lower portion to an upper portion of the reaction tube 203. When a pressure difference between an interior of the buffer chamber 237 and an interior of the process chamber 201 is small, the plurality of the gas supply holes 250c may be configured to have a constant opening area and a constant opening pitch from an upstream side (i.e., a lower portion) to a downstream side (i.e., an upper portion). In contrast, when the pressure difference is large, the opening area may become larger and the opening pitch may become smaller in a direction from the upstream side to the downstream side.

In the present embodiment, by adjusting the opening area or the opening pitch of each of the gas supply holes 250c in the third nozzle 249c from the upstream side to the downstream side as described above, gas is flown out from the individual gas supply holes 250c at an almost constant flow rate although a flow velocity for each of the gas supply holes 250c may be different. The gas flown out from the individual gas supply holes 250c is introduced into the buffer chamber 237 and the different flow velocity of the gas then becomes uniform within the buffer chamber 237. In this case, particle velocities of the gas flown out from the individual gas supply holes 250c of the third nozzle 249c into the buffer chamber 237 are mitigated within the buffer chamber 237, and the gas is then flown out from the individual gas supply holes 250e of the buffer chamber 237 into the process chamber 201. Thus, the gas which has been flown out from the individual gas supply holes 250c of the third nozzle 249c into the buffer chamber 237 can have a substantially uniform flow rate and a substantially uniform flow velocity when it is flown out from the individual gas supply holes 250e of the buffer chamber 237 into the process chamber 201.

A third gas supply system mainly includes the third gas supply pipe 232c, the mass flow controller 241c, and the valve 243c. The third gas supply system may also include the third nozzle 249c and the buffer chamber 237. In addition, a third inert gas supply system mainly includes the third inert gas supply pipe 232h, the mass flow controller 241h, and the valve 243h. The third inert gas supply system may also serve as a purge gas supply system.

A mass flow controller (MFC) 241d serving as a flow rate controller (i.e., a flow rate control part) and a valve 243d serving as an opening/closing valve are sequentially installed in the fourth gas supply pipe 232d from an upstream side. The fifth gas supply pipe 232e is connected to the fourth gas supply pipe 232d at a more downstream side of the valve 243d. A mass flow controller (MFC) 241e serving as a flow rate controller (i.e., a flow rate control part) and a valve 243e serving as an opening/closing valve are sequentially installed in the fifth gas supply pipe 232e from an upstream side. In addition, a fourth inert gas supply pipe 232i is connected to the fourth gas supply pipe 232d at a more downstream side of a connection portion of the fourth gas supply pipe 232d and the fifth gas supply pipe 232e. A mass flow controller 241i serving as a flow rate controller (i.e., a flow rate control part) and a valve 243i serving as an opening/closing valve are sequentially installed in the fourth inert gas supply pipe 232i from an upstream side. In addition, the fourth nozzle 249d is connected to an end portion of the fourth gas supply pipe 232d. The fourth nozzle 249d is installed in an arc-shaped space between the inner wall of the reaction tube 203 and the wafers 200 such that the fourth nozzle 249d extends upward in the stacked direction of the wafers 200 from a lower portion of the inner wall of the reaction tube 203 to an upper portion thereof. Specifically, the fourth nozzle 249d is installed along the wafer arrangement region where the wafers 200 are arranged, and in a region that horizontally surrounds the wafer arrangement region at a side of the wafer arrangement region. The fourth nozzle 249d is configured as an L-shaped nozzle, and its horizontal portion is installed to penetrate through the lower sidewall of the reaction tube 203 while its vertical portion is installed to ascend at least from one end portion to the other end portion of the wafer arrangement region. A gas supply hole 250d for supplying gas is installed at a side surface of the fourth nozzle 249d. The gas supply hole 250d is opened toward the center of the reaction tube 203 to allow the gas to be supplied to the wafers 200. A plurality of gas supply holes 250d is installed at a predetermined opening pitch from a lower portion to an upper portion of the reaction tube 203. Each of the gas supply holes 250d may have the same opening area. A fourth gas supply system mainly includes the fourth gas supply pipe 232d, the mass flow controller 241d, and the valve 243d. The fourth gas supply system may also include the fourth nozzle 249d. In addition, a fifth gas supply system mainly includes the fifth gas supply pipe 232e, the mass flow controller 241e, and the valve 243e. The fifth gas supply system may also include a portion of the fourth nozzle 249d at a more downstream side of the connection portion of the fourth gas supply pipe 232d and the fifth gas supply pipe 232e. Further, a fourth inert gas supply system mainly includes the fourth inert gas supply pipe 232i, the mass flow controller 241i, and the valve 243i. The fourth inert gas supply system may also serve as a purge gas supply system.

As described above, the gas supply method according to the present embodiment transfers gases via the nozzles 249a, 249b, 249c, and 249d and the buffer chamber 237, which are arranged within the arc-shaped longitudinal space defined by the inner wall of the reaction tube 203 and end portions of the stacked wafers 200, and first supplies the gases from the gas supply holes 250a, 250b, 250c, 250d, and 250e (which are opened in the nozzles 249a, 249b, 249c, and 249d, and buffer chamber 237, respectively) into the reaction tube 203, near the wafers 200. Accordingly, the gases supplied into the reaction tube 203 mainly flow within the reaction tube 203 in a direction parallel to surfaces of the wafers 200, i.e., in a horizontal direction. According to the above configuration, the gases can be uniformly supplied to the individual wafers 200, thereby making a thickness of a thin film formed on each of the wafers 200 uniform. In addition, the gases flowing on the surfaces of the wafers 200 after reaction, i.e., residual gases, flow toward an exhaust port, i.e., an exhaust pipe 231, which will be described later. However, the flow direction of the residual gases may be appropriately decided depending on a position of the exhaust port, and is not limited to a vertical direction.

A first precursor gas containing boron (B) and a halogen group, for example, a boron halide-based precursor gas which is a precursor gas containing at least boron (B) and a halogen group such as a chloro group, is supplied from the first gas supply pipe 232a into the process chamber 201 through the mass flow controller 241a, the valve 243a, and the first nozzle 249a. Here, the boron halide-based precursor gas may refer to a boron halide-based precursor in a gaseous state, for example, obtained by vaporizing a boron halide-based precursor in a liquid state under the normal temperature and pressure, a boron halide-based precursor in a gaseous state under the normal temperature and pressure, or the like. In addition, the boron halide-based precursor refers to a kind of halide including a halogen ligand such as a chloro ligand (Cl) and refers to a precursor containing at least boron (B) and a halogen element such as chlorine (Cl). The boron halide-based precursor functions as a boron source. In addition, as used herein the term "precursor" may refer to "a liquid precursor in a liquid state," "a precursor gas in a gaseous state," or both of them. Therefore, as used herein, the term "boron halide-based precursor" may refer to "a boron halide-based precursor in a liquid state," "a boron halide-based precursor gas in a gaseous state," or both of them. For example, a boron halide-based precursor gas may include boron trichloride ($BCl_3$) gas. When a liquid precursor in a liquid state under the normal temperature and pressure such as $BCl_3$ is used, the liquid precursor may be vaporized by a vaporization system, such as a vaporizer or a bubbler, and supplied as a precursor gas (e.g., $BCl_3$ gas).

A second precursor gas containing a predetermined element and an amino group (or amine group), for example, an aminosilane-based precursor gas which is a second precursor gas containing at least silicon (Si) and an amino group, is supplied from the second gas supply pipe 232b into the process chamber 201 through the mass flow controller 241b, the valve 243b, and the second nozzle 249b. Here, the aminosilane-based precursor may refer to a silane-based precursor containing an amino group (which may be a silane-based precursor containing an alkyl group such as a methyl group, an ethyl group, or a butyl group) and also refer to a precursor containing at least silicon (Si), carbon (C), and nitrogen (N). Thus, the aminosilane-based precursor described herein may also be referred to as an organic-based precursor or an organic aminosilane-based precursor. The aminosilane-based precursor functions as a silicon source, a carbon source, and a nitrogen source. As used herein, the term "aminosilane-based precursor" may refer to "an aminosilane-based precursor in a liquid state," "an aminosilane-based precursor gas in a gaseous state," or both of them. For example, tris(dimethylamino)silane ($Si[N(CH_3)_2]_3H$, abbreviation: 3DMAS) gas may be used as the aminosilane-based precursor gas. When a liquid precursor in a liquid state under the normal temperature and pressure, such as 3DMAS, is used, the liquid precursor may be vaporized by a vaporization system, such as a vaporizer or a bubbler, and supplied as a precursor gas (e.g., 3DMAS gas).

A nitriding gas (or a nitrogen-containing gas) is supplied from the third gas supply pipe 232c into the process chamber 201 through the mass flow controller 241c, the valve 243c, the third nozzle 249c, and the buffer chamber 237. The nitriding gas may include, for example, ammonia ($NH_3$) gas. The nitriding gas functions as a nitrogen source.

A gas containing carbon (C) (i.e., a carbon-containing gas), for example, a hydrocarbon-based gas, is supplied from the fourth gas supply pipe 232d into the process chamber 201 through the mass flow controller 241d, the valve 243d, and the fourth nozzle 249d. For example, the carbon-containing gas may include propylene ($C_3H_6$) gas. The carbon-containing gas functions as a carbon source.

A gas containing nitrogen (N) and carbon (C), for example, an amine-based gas, is supplied from the fifth gas supply pipe 232e into the process chamber 201 through the mass flow controller 241e, the valve 243e, the fourth gas supply pipe 232d, and the fourth nozzle 249d. Here, the amine-based gas may refer to a gas containing an amine group such as a gas obtained by vaporizing amine, and also refer to a gas containing carbon (C), nitrogen (N), and hydrogen (H). The amine-based gas includes amine such as ethylamine, methylamine, propylamine, isopropylamine, butylamine, and isobutylamine. Here, the term "amine" is a generic name of a compound in which a hydrogen atom in ammonia ($NH_3$) is substituted with a hydrocarbon group such as an alkyl group. As such, amine contains a hydrocarbon group such as an alkyl group. The amine-based gas may be referred to as silicon-free gas as the amine-based gas does not contain silicon (Si), or may be referred to as silicon-free and metal-free gas as the amine-based gas does not contain silicon and metal. The amine-based gas may include, for example, triethylamine (($C_2H_5)_3N$, abbreviation: TEA) gas. The amine-based gas functions as a carbon source and a nitrogen source. In addition, when amine in a liquid state under the normal temperature and pressure, such as TEA, is used, the amine in a liquid state is vaporized by a vaporization system such as a vaporizer or a bubbler and supplied as the amine-based gas, i.e., the gas containing carbon and nitrogen (e.g., TEA gas).

For example, nitrogen ($N_2$) gas is supplied from each of the inert gas supply pipes 232f, 232g, 232h, and 232i into the process chamber 201 through the mass flow controllers 241f, 241g, 241h, and 241i, the valves 243f, 243g, 243h, and 243i, the gas supply pipes 232a, 232b, 232c, and 232d, the nozzles 249a, 249b, 249c and 249d, and the buffer chamber 237.

When the above-described gases are supplied to flow through the individual gas supply pipes, the first gas supply system constitutes a first precursor gas supply system for supplying the first precursor containing boron and a halogen group, for example, a boron halide-based precursor gas supply system. Further, the boron halide-based precursor gas supply system may be simply referred to as a boron halide-based precursor supply system. The second gas supply system constitutes a second precursor gas supply system for supplying the second precursor containing a predetermined element and an amino group, for example, an aminosilane-based precursor gas supply system. Further, the aminosilane-based precursor gas supply system may be simply referred to as an aminosilane-based precursor supply system. The third gas supply system constitutes a nitriding gas (or nitrogen-containing gas) supply system. The fourth gas supply system constitutes a carbon-containing gas supply system, for example, a hydrocarbon-based gas supply system. The fifth gas supply system constitutes a nitrogen- and carbon-containing gas supply system, for example, an amine-based gas supply system.

In the buffer chamber 237, as illustrated in FIG. 2, a first rod-shaped electrode 269 serving as a first electrode having an elongated structure and a second rod-shaped electrode 270 serving as a second electrode having an elongated structure are installed from a lower portion to an upper portion of the reaction tube 203 in the stacked direction of the wafers 200. Each of the first rod-shaped electrode 269 and the second rod-shaped electrode 270 is installed in parallel to the third nozzle 249c. Each of the first rod-shaped electrode 269 and the second rod-shaped electrode 270 is covered with and protected by an electrode protection tube 275, which is a protection tube for protecting each electrode from an upper portion to a lower portion thereof. One of the first rod-shaped electrode 269 and the second rod-shaped electrode 270 is connected to a high-frequency power source 273 through a matcher 272, and the other one is connected to a ground corresponding to a reference electric potential. By applying high-frequency power from the high-frequency power source 273 between the first rod-shaped electrode 269 and the second rod-shaped electrode 270 through the matcher 272, plasma is generated in a plasma generation region 224 between the first rod-shaped electrode 269 and the second rod-shaped electrode 270. A plasma source as a plasma generator (i.e., plasma generating part) mainly includes the first rod-shaped electrode 269, the second rod-shaped electrode 270, and the electrode protection tubes 275. The plasma source may also include the matcher 272 and the high-frequency power source 273. Also, as will be described later, the plasma source functions as an activating unit (or exciting part) that activates (or excites) gas with plasma.

Each of the electrode protection tubes 275 has a structure in which either the first rod-shaped electrode 269 or the second rod-shaped electrode 270 is inserted into the buffer chamber 237 in a state where the inserted rod-shaped electrode is isolated from an internal atmosphere of the buffer chamber 237. In this case, when an internal oxygen concentration of the electrode protection tube 275 is substantially equal to an oxygen concentration in the ambient air (i.e., atmosphere), the first rod-shaped electrode 269 and the second rod-shaped electrode 270 inserted into the electrode protection tubes 275 may be oxidized by the heat generated by the heater 207. Therefore, by charging the inside of the electrode protection tube 275 with an inert gas such as nitrogen gas, or by purging the inside of the electrode protection tube 275 with an inert gas such as nitrogen gas using an inert gas purging mechanism, the internal oxygen concentration of the electrode protection tube 275 decreases and thus, oxidation of the first rod-shaped electrode 269 and the second rod-shaped electrode 270 can be prevented.

The exhaust pipe 231 for exhausting an internal atmosphere of the process chamber 201 is installed at the reaction tube 203. A vacuum pump 246 serving as a vacuum exhaust device is connected to the exhaust pipe 231 through a pressure sensor 245 as a pressure detector (i.e., pressure detecting part) for detecting an internal pressure of the process chamber 201 and an auto pressure controller (APC) valve 244 serving as a pressure regulator (i.e., pressure regulating part). The APC valve 244 is configured to perform or stop vacuum-exhaust in the process chamber 201 by opening or closing the valve with the actuated vacuum pump 246 and further to regulate the internal pressure of the process chamber 201 by adjusting an opening degree of the valve with the actuated vacuum pump 246. An exhaust system mainly includes the exhaust pipe 231, the APC valve 244, and the pressure sensor 245. The exhaust system may also include the vacuum pump 246. The exhaust system is configured to, while operating the vacuum pump 246, adjust the opening degree of the APC valve 244 based on pressure information detected by the pressure sensor 245 such that the internal pressure of the process chamber 201 is vacuum-exhausted to a predetermined pressure (i.e., a predetermined vacuum level).

A seal cap 219, which functions as a furnace port cover configured to hermetically seal a lower end opening of the reaction tube 203, is installed below the reaction tube 203. The seal cap 219 is configured to make contact with a lower end of the reaction tube 203 from its bottom in the vertical direction. The seal cap 219 is made of, for example, metal such as stainless steel or the like and is formed in a disc shape. An O-ring 220 as a seal member making contact with the lower end portion of the reaction tube 203 is installed on an upper surface of the seal cap 219. A rotation mechanism 267 configured to rotate the boat 217 as a substrate holder, which will be described later, is installed below the seal cap 219. A rotary shaft 255 of the rotation mechanism 267 is configured to pass through the seal cap 219 to be connected to the boat 217. The rotation mechanism 267 is configured to rotate the wafers 200 by rotating the boat 217. The seal cap 219 is configured to be vertically elevated or lowered by a boat elevator 115 as an elevation mechanism vertically installed outside the reaction tube 203. The boat elevator 115 is configured to enable the boat 217 to be loaded into or unloaded from the process chamber 201 by elevating or lowering the seal cap 219. Specifically, the boat elevator 115 is configured as a transfer device (i.e., a transfer mechanism) that transfers the boat 217, i.e., the wafers 200, into and out of the process chamber 201.

The boat 217, which is used as a substrate support, is made of, for example, a heat resistant material such as quartz or silicon carbide and is configured to support the wafers 200 horizontally stacked in multiple stages with the centers of the wafers 200 concentrically aligned. In addition, a heat insulating member 218 formed of, for example, a heat resistant material such as quartz or silicon carbide is installed below the boat 217 and is configured such that the heat generated from the heater 207 is not transferred to the seal cap 219. Moreover, the heat insulating member 218 may be configured by a plurality of heat insulating plates made of a heat resistant material such as quartz or silicon carbide and a heat insulating plate holder configured to support the heat insulating plates in a horizontal position in a multi-stage manner.

A temperature sensor 263 serving as a temperature detector is installed in the reaction tube 203. Based on temperature information detected by the temperature sensor 263, a supply of an electric current to the heater 207 is adjusted such that the internal temperature of the process chamber 201 is maintained at a desired temperature distribution. Similar to the nozzles 249a, 249b, 249c, and 249d, the temperature sensor 263 is formed as an L-shape and installed along the inner wall of the reaction tube 203.

Figure 3:
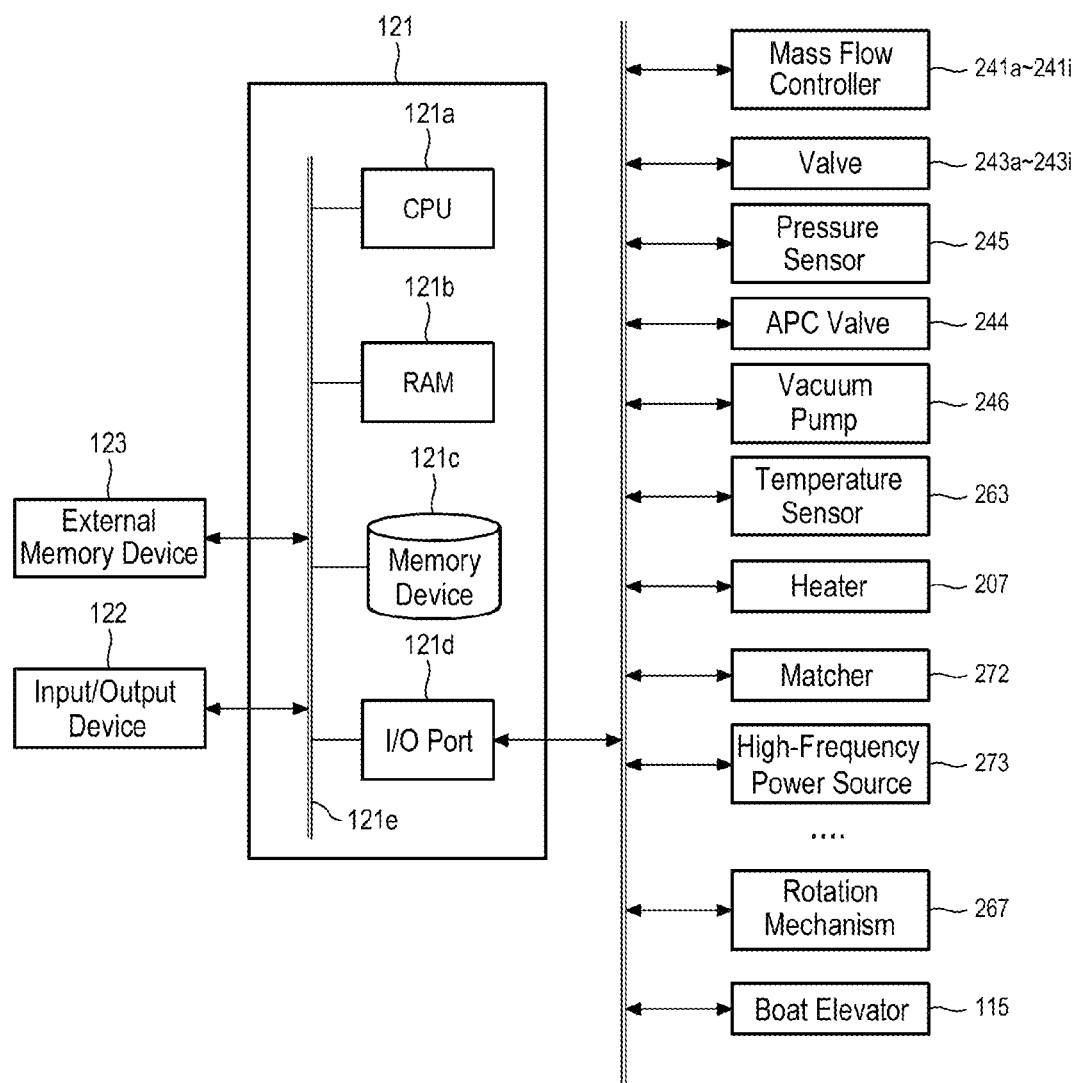

As illustrated in FIG. 3, a controller 121 as a control unit (or control part) is configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e. An input/output device 122, for example, including a touch panel or the like, is connected to the controller 121.

The memory device 121c is configured with, for example, a flash memory, a hard disc drive (HDD), or the like. A control program for controlling operations of the substrate processing apparatus or a process recipe defining a sequence or condition for processing a substrate, which will be described later, is readably stored in the memory device 121c. The process recipe, which functions as a program, is configured to cause the controller 121 to execute individual sequences in the substrate processing process which will be described later so that predetermined results are obtained. Hereinafter, such a process recipe or a control program may be generally referred to as "a program." As user herein, the term "program" may indicate only a process recipe, only a control program, or both a process recipe and a control program. In addition, the RAM 121b is configured as a memory area (or work area) in which a program or data read by the CPU 121a is temporarily stored.

The I/O port 121d is connected to the mass flow controllers 241a, 241b, 241c, 241d, 241e, 241f, 241g, 241h, and 241i, the valves 243a, 243b, 243c, 243d, 243e, 243f, 243g, 243h, and 243i, the pressure sensor 245, the APC valve 244, the vacuum pump 246, the heater 207, the temperature sensor 263, the high-frequency power source 273, the matcher 272, the rotation mechanism 267, the boat elevator 115 and the like.

The CPU 121a is configured to read the control program from the memory device 121c and execute the control program. The CPU 121a is configured to read the process recipe from the memory device 121c in response to an input as an operation command from the input/output device 122. In addition, the CPU 121a is configured to, according to content of the read process recipe, control the flow rate controlling operations of various kinds of gases performed by the mass flow controllers 241a, 241b, 241c, 241d, 241e, 241f, 241g, 241h, and 241i, the opening/closing operations of the valves 243a, 243b, 243c, 243d, 243e, 243f, 243g, 243h, and 243i, the opening/closing operations of the APC valve 244, the pressure regulating operation performed by the APC valve 244 based on the pressure sensor 245, the operation of starting and stopping the vacuum pump 246, the temperature regulating operation of the heater 207 based on the temperature sensor 263, the operation of supplying power performed by the high-frequency power source 273, the impedance adjusting operation performed by the matcher 272, the operations of rotating the boat 217 and adjusting the rotation speed of the boat 217 rotated by the rotation mechanism 267, the elevation operation of the boat 217 by the boat elevator 115, and the like.

Moreover, the controller 121 is not limited to a dedicated computer but may be a general-purpose computer. For example, the controller 121 in the present embodiment may be configured by installing the above described program on the general-purpose computer using an external memory device 123 in which the program is stored (e.g., a magnetic tape, a magnetic disc such as a flexible disc or a hard disc, an optical disc such as a CD or DVD, a magneto-optical disc such as an MO or the like, a semiconductor memory such as a USB memory or a memory card). Furthermore, means for supplying a program to a computer is not limited to the case in which the program is supplied through the external memory device 123. For example, the program may be supplied using a communication means such as the Internet or a dedicated line, rather than through the external memory device 123. Moreover, the memory device 121*c* or the external memory device 123 may be configured as a non-transitory computer-readable recording medium. Hereinafter, these means for supplying the program will be simply referred to as "a recording medium." In addition, the term "recording medium" used herein is intended to include only the memory device 121*c*, only the external memory device 123, or both of them.

(2) Substrate Processing Process

An example of a sequence for forming a thin film on a substrate, which is one of the processes of manufacturing a semiconductor device by using the processing furnace 202 in the above-described substrate processing apparatus, will be described below. In addition, in the following descriptions, operations of the respective parts constituting the substrate processing apparatus are controlled by the controller 121.

Further, in the present embodiment, in order to form a composition ratio of a thin film to be a stoichiometric composition ratio or another predetermined composition ratio different from the stoichiometric composition, supply conditions of different kinds of gases containing a plurality of elements constituting the film to be formed are controlled. For example, the supply conditions are controlled such that at least one element in a plurality of elements constituting the thin film to be formed stoichiometrically exceeds another element. Hereinafter, an example of a sequence for forming a film while controlling a ratio of the plurality of elements constituting the thin film to be formed, i.e., a composition ratio of the film, will be described.

In a film forming sequence of this embodiment, a thin film containing a predetermined element, boron, carbon, and nitrogen is formed on a substrate by performing a cycle a predetermined number of times, the cycle including forming a first layer containing boron and a halogen group by supplying a first precursor gas containing boron and the halogen group to the substrate; and forming a second layer containing the predetermined element, boron, carbon, and nitrogen by supplying a second precursor gas containing the predetermined element and an amino group to the substrate and modifying the first layer.

Further, in the act of forming the second layer, the first layer may react with the second precursor gas to extract, from the first layer, at least a portion of atoms constituting the halogen group in the first layer and separate, from the second precursor gas, at least a portion of ligands including the amino group in the second precursor gas.

Specifically, in the act of forming the second layer, at least a portion of atoms constituting the halogen group in the first layer may react with at least a portion of ligands including the amino group in the second precursor gas. As such, the act of forming the second layer may be performed under the conditions in which the atoms constituting the halogen group in the first layer react with the ligands including the amino group in the second precursor gas. Accordingly, the atoms constituting the halogen group and reacting with the ligands including the amino group in the second precursor gas may be separated (or extracted) from the first layer, and the ligands including the amino group and reacting with the atoms constituting the halogen group may be separated from the second precursor gas. Then, the boron in the first layer may be bonded to the predetermined element in the second precursor gas from which at least the portion of the ligands including the amino group is separated.

Further, the phrase "performing a predetermined number of times a cycle in which forming a first layer and forming a second layer are performed in that order" may mean that a cycle performing forming the first layer and forming the second layer in that order is set as one cycle and the cycle is performed one or more times. As such, the phrase may mean that the cycle, which is performed in the above order, is performed one or more times. In other words, the phrase may also mean that a cycle in which forming the first layer and forming the second layer are performed in that order is performed once or repeated a plurality of times. However, it may be preferable that the cycle, which is performed in the above order, is repeated a plurality of times.

In the present embodiment, a wafer such as a silicon wafer which is a semiconductor substrate is used as the substrate. In addition, a boron halide-based precursor gas containing boron and a chloro group may be used as the first precursor gas containing boron and the halogen group. Further, an aminosilane-based precursor gas containing silicon and an amino group may be used as the second precursor gas containing the predetermined element and the amino group. Furthermore, a layer containing boron and the chloro group (chlorine) (i.e., boron-containing layer containing chlorine) may be formed as the first layer containing boron and the halogen group. Also, a layer containing silicon, boron, carbon, and nitrogen (e.g., silicon borocarbonitride layer) may be formed as the second layer by modifying the first layer. In addition, a thin film containing silicon, boron, carbon, and nitrogen (e.g., silicon borocarbonitride film) may also be formed as the thin film.

Figure 4:
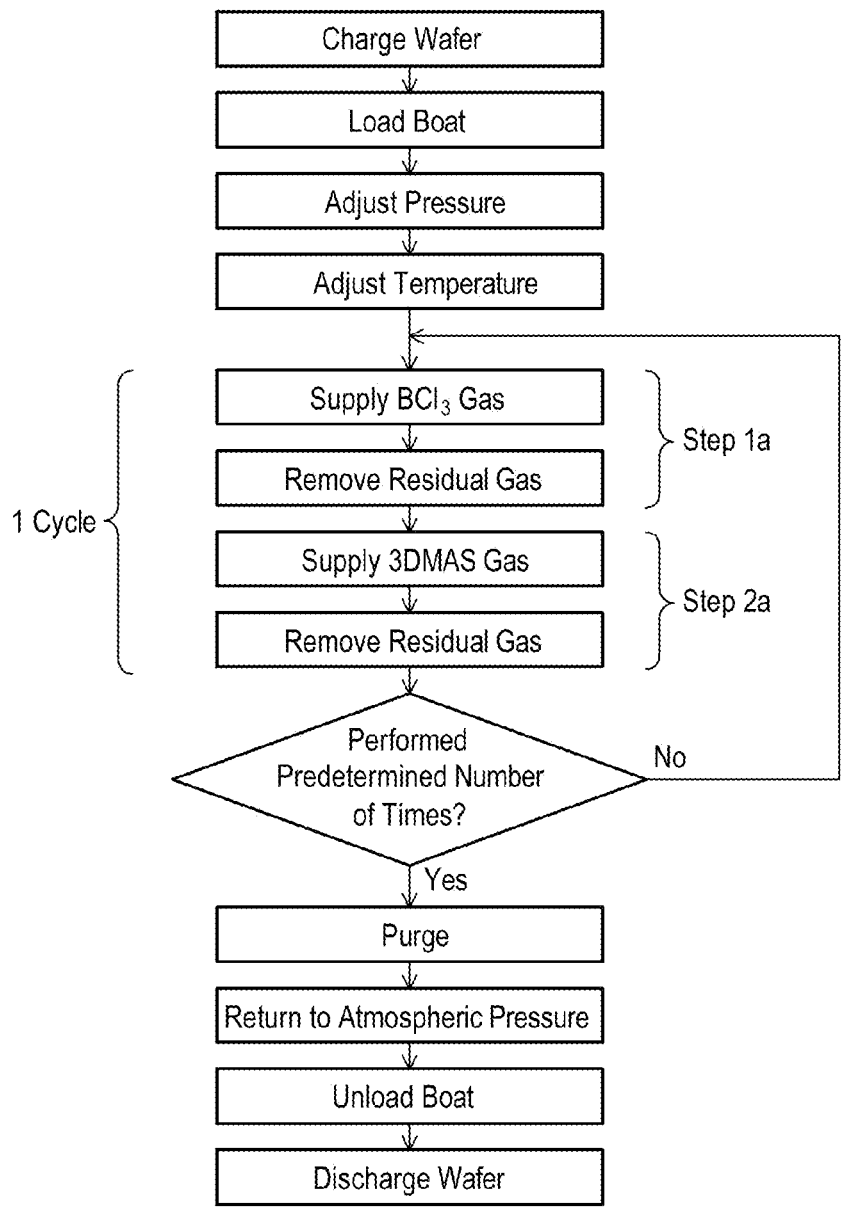
Figure 5A:
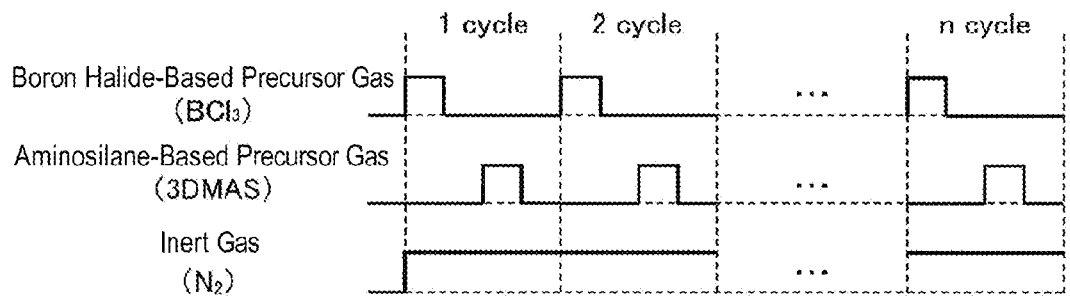

Hereinafter, the film forming sequence of the present embodiment is described in detail. FIG. 4 illustrates a flowchart of film forming in the film forming sequence according to the present embodiment. FIG. 5A illustrates gas supply timings in the film forming sequence according to the present embodiment.

In the film forming sequence of the present embodiment, a silicon borocarbonitride layer (hereinafter, referred to as a SiBCN layer) as a thin film containing silicon, boron, carbon, and nitrogen is formed on the wafer 200 within the process chamber 201 by performing a cycle a predetermined number of times, the cycle performing, in the following order, forming a boron-containing film containing chlorine (hereinafter, referred to as a boron-containing film containing Cl) as a first film containing boron and a chloro group (chlorine) by supplying a boron halide-based precursor gas containing boron and the chloro group to the wafer 200; and forming a silicon borocarbonitride film (hereinafter, referred to as a SiBCN film) as a second film containing silicon, boron, carbon, and nitrogen by supplying an aminosilane-based precursor gas containing silicon and an amino group to the wafer 200 and modifying the first layer.

In addition, FIGS. 4 and 5A illustrate an example of alternately performing, a predetermined number of times, supplying the boron halide-based precursor gas and supplying the aminosilane-based precursor gas.

As used herein, the term "wafer" may refer to "a wafer itself" or "a wafer and a laminated body (a collected body) of predetermined layers or films formed on a surface of the wafer" (i.e., a wafer including predetermined layers or films formed on its surface may be referred to as a wafer). In addition, as used herein, the phrase "a surface of a wafer" may refer to "a surface (or an exposed surface) of a wafer itself" or "a surface of a predetermined layer or film formed on a wafer, i.e., an uppermost surface of the wafer, which is a laminated body."

As such, as used herein, the phrase "a predetermined gas is supplied to a wafer" may mean that "a predetermined gas is directly supplied to a surface (or an exposed surface) of a wafer itself" or that "a predetermined gas is supplied to a layer or a film formed on a wafer, i.e., on an uppermost surface of a wafer as a laminated body." Also, as used herein, the phrase "a predetermined layer (or film) is formed on a wafer" may mean that "a predetermined layer (or film) is directly formed on a surface (or an exposed surface) of a wafer itself" or that "a predetermined layer (or film) is formed on a layer or a film formed on a wafer, i.e., on an uppermost surface of a wafer as a laminated body."

In addition, the term "substrate" as used herein may be synonymous with the term "wafer" and, in this case, the terms "wafer" and "substrate" may be used interchangeably in the above description.

Hereinafter, the film forming sequence in the present embodiment is described in more detail. Specifically, an example is described in which the SiBCN film is formed on the wafer 200 according to the film forming flow of FIG. 4 and the film forming sequence of FIG. 5A using $BCl_3$ gas, which is a boron compound having one or more, specifically, three chloro groups (i.e., chloro ligands), as the boron halide-based precursor gas, and 3DMAS gas, which is an aminosilane having one or more, specifically, three amino groups (i.e., amino ligands), as the aminosilane-based precursor gas.

(Wafer Charging and Boat Loading)

When the plurality of wafers 200 are charged on the boat 217 (i.e., wafer charging), as illustrated in FIG. 1, the boat 217 supporting the plurality of wafers 200 is lifted upward by the boat elevator 115 and is loaded into the process chamber 201 (i.e., boat loading). In this state, the seal cap 219 seals the lower end portion of the reaction tube 203 via the O-ring 220.

(Pressure Adjustment and Temperature Adjustment)

The interior of the process chamber 201 is vacuum-exhausted by the vacuum pump 246 to a desired pressure (or a desired vacuum level). In this case, the internal pressure of the process chamber 201 is measured by the pressure sensor 245. The APC valve 244 is feedback-controlled based on the measured pressure information (i.e., pressure regulation). The vacuum pump 246 may be continuously operated at least until the processing to the wafers 200 is completed. The wafers 200 in the process chamber 201 are heated by the heater 207 to a desired temperature. In this case, the state of supplying an electric current to the heater 207 is feedback-controlled based on the temperature information detected by the temperature sensor 263 such that the temperature distribution of the interior of the process chamber 201 reaches a desired temperature distribution (i.e., temperature adjustment). In addition, the heating of the interior of the process chamber 201 by the heater 207 may be continuously performed at least until the processing of the wafers 200 is completed. Subsequently, the boat 217 and wafers 200 begin to be rotated by the rotation mechanism 267 (i.e., wafer rotation). Furthermore, the rotation of the boat 217 and wafers 200 by the rotation mechanism 267 may be continuously performed at least until the processing of the wafers 200 is completed.

(Process of Forming Silicon Borocarbonitride Film)

Next, the following two steps, i.e., Steps 1a and 2a, are sequentially performed.

[Step 1a]

($BCl_3$ Gas Supply)

The valve 243a of the first gas supply pipe 232a is opened to flow the $BCl_3$ gas into the first gas supply pipe 232a. A flow rate of the $BCl_3$ gas flowing in the first gas supply pipe 232a is adjusted by the mass flow controller 241a. The flow-rate-adjusted $BCl_3$ gas is supplied into the process chamber 201 through the gas supply holes 250a of the first nozzle 249a and exhausted through the exhaust pipe 231. As such, the $BCl_3$ gas is supplied to the wafer 200 (i.e., $BCl_3$ gas supply). In this case, the valve 243f is opened to flow the $N_2$ gas as an inert gas into the first inert gas supply pipe 232f. A flow rate of the $N_2$ gas flowing in the first inert gas supply pipe 232f is adjusted by the mass flow controller 241f. The flow-rate-adjusted $N_2$ gas is supplied into the process chamber 201 together with the $BCl_3$ gas and exhausted through the exhaust pipe 231. During this operation, the valves 243g, 243h, and 243i are opened to flow $N_2$ gas into the second inert gas supply pipe 232g, the third inert gas supply pipe 232h, and the fourth inert gas supply pipe 232i in order to prevent infiltration of the $BCl_3$ gas into the second nozzle 249b, the third nozzle 249c, the fourth nozzle 249d, and the buffer chamber 237. The $N_2$ gas is supplied into the process chamber 201 through the second gas supply pipe 232b, the third gas supply pipe 232c, the fourth gas supply pipe 232d, the second nozzle 249b, the third nozzle 249c, the fourth nozzle 249d, and the buffer chamber 237, and exhausted through the exhaust pipe 231.

In this case, the APC valve 244 is appropriately adjusted such that the internal pressure of the process chamber 201 falls within, for example, a range of 1 to 13,300 Pa, specifically, 20 to 1,330 Pa. The supply flow rate of the $BCl_3$ gas controlled by the mass flow controller 241a is set to fall within, for example, a range of 1 to 1,000 sccm. The supply flow rate of the $N_2$ gas controlled by each of the mass flow controllers 241f, 241g, 241h, and 241i is set to fall within, for example, a range of 100 to 10,000 sccm. The time for supplying the $BCl_3$ gas to the wafers 200, in other words, a gas supply time (i.e., an irradiation time), is set to fall within, for example, a range of 1 to 120 seconds, specifically, 1 to 60 seconds. In this case, the temperature of the heater 207 is set such that a temperature of the wafers 200 falls within, for example, a range of 250 to 700 degrees C., specifically, 300 to 650 degrees C., more specifically, 350 and 600 degrees C. When the temperature of the wafers 200 is less than 250 degrees C., the $BCl_3$ may hardly be chemically adsorbed onto the wafers 200. This may sometimes make it impossible to obtain a practical film forming rate. This problem can be solved by setting the temperature of the wafer 200 equal to or higher than 250 degrees C. Further, the $BCl_3$ can be more sufficiently adsorbed onto the wafers 200 and a more sufficient film forming rate can be obtained by setting the temperature of the wafers 200 equal to or higher than 300 degrees C., or equal to or higher than 350 degrees C. or more. When the temperature of the wafer 200 exceeds 700 degrees C., a CVD reaction become intensive (in other words, a gas phase reaction becomes dominant). Thus, the film thickness uniformity is often deteriorated and becomes hard to control. By setting the temperature of the wafer 200 equal to or lower than 700 degrees C., the deterioration of the film thickness uniformity can be suppressed and thus, it becomes possible to control the film thickness uniformity. In particular, a surface reaction becomes dominant by setting the temperature of the wafers 200, for example, equal to or lower than 650 degrees C., specifically, equal to or lower than 600 degrees C., and thus, it becomes easy to secure and control uniformity of the film thickness. Accordingly, the temperature of the wafers 200 may be set to fall within, for example, a range of 250 to 700 degrees C., specifically, 300 to 650 degrees C., more specifically, 350 to 600 degrees C.

By supplying the $BCl_3$ gas to the wafer 200 under the above-described conditions, a boron-containing layer containing chlorine (Cl) having a thickness, for example, from less than one atomic layer to several atomic layers is formed as a first layer on the wafer 200. The boron-containing layer containing chlorine (Cl) may be an adsorption layer of the BCl$_3$ gas, a boron layer (B layer) containing Cl, or both of these.

Here, the phrase "boron layer containing Cl" is a generic name which encompasses a continuous or discontinuous layer that is formed of boron (B) and contains Cl, and a boron thin film containing Cl that is formed by laminating such layers. The continuous layer that is formed of B and contains Cl may be referred to as a boron thin film containing Cl. In addition, B constituting the boron layer containing Cl contains B whose bond to Cl is completely broken, in addition to B whose bond to Cl is not completely broken.

The adsorption layer of the BCl$_3$ gas may include a continuous chemical adsorption layer, in which gas molecules of the BCl$_3$ gas are continuous, and a discontinuous chemical adsorption layer, in which gas molecules of the BCl$_3$ gas are discontinuous. In other words, the adsorption layer of the BCl$_3$ gas may include a chemical adsorption layer formed of BCl$_3$ molecules and having a thickness of one molecular layer or less than one molecular layer. BCl$_3$ molecules constituting the adsorption layer of the BCl$_3$ gas include one or more molecules in which a bond between B and Cl is partially broken (e.g., B$_x$Cl$_y$ molecules). In other words, the adsorption layer of the BCl$_3$ gas includes a continuous chemical adsorption layer and a discontinuous chemical adsorption layer of BCl$_3$ molecules and/or B$_x$Cl$_y$ molecules.

A layer having a thickness of less than one atomic layer refers to a discontinuously formed atomic layer. A layer having a thickness of one atomic layer refers to a continuously formed atomic layer. In addition, a layer having a thickness of less than one molecular layer refers to a discontinuously formed molecular layer. A layer having a thickness of one molecular layer refers to a continuously formed molecular layer.

Under a condition in which the BCl$_3$ gas is autolyzed (or pyrolyzed), i.e., under a condition in which a pyrolysis reaction of the BCl$_3$ gas occurs, B is deposited on the wafer 200 to form the boron layer containing Cl. Under a condition in which the BCl$_3$ gas is not autolyzed (or pyrolyzed), i.e., under a condition in which a pyrolysis reaction of the BCl$_3$ gas does not occur, the BCl$_3$ gas is adsorbed onto the wafer 200 to form the adsorption layer of the BCl$_3$ gas. In addition, a film forming rate when the boron layer containing Cl is formed on the wafer 200 may be greater than that when the adsorption layer of the BCl$_3$ gas is formed on the wafer 200.

When the thickness of the boron-containing layer containing Cl formed on the wafer 200 exceeds several atomic layers, an effect of a modification reaction in Step 2a, which will be described later, is not applied to the entire boron-containing layer containing Cl. On the other hand, a minimum value of the thickness of the boron-containing layer containing Cl that can be formed on the wafer 200 is less than one atomic layer. Accordingly, the thickness of the boron-containing layer containing Cl may range from less than one atomic layer to several atomic layers. In addition, when the thickness of the boron-containing layer containing Cl is set to be one atomic layer or less (i.e., one atomic layer or less than one atomic layer), the effect of the modification reaction in Step 2a, which will be described later, can be relatively increased. This makes it possible to shorten a time required for the modification reaction in Step 2a. It is also possible to shorten a time required for forming the boron-containing layer containing Cl in Step 1a. As a result, a processing time per cycle can be reduced and a total processing time can also be reduced. As such, the film forming rate can be increased. In addition, if the thickness of the boron-containing layer containing Cl is one atomic layer or less, it becomes possible to better control the film thickness uniformity.

(Residual Gas Removal)

After the boron-containing layer containing Cl is formed as the first layer, the valve 243a of the first gas supply pipe 232a is closed to stop the supply of the BCl$_3$ gas. At this time, while the APC valve 244 of the exhaust pipe 231 is in an open state, the interior of the process chamber 201 is vacuum-exhausted by the vacuum pump 246 to remove the BCl$_3$ gas remaining in the process chamber 201 which has not reacted or remains after contributing to the formation of the boron-containing layer containing Cl, from the process chamber 201 (i.e., residual gas removal). In this operation, the supply of the N$_2$ gas as an inert gas into the process chamber 201 is maintained by keeping the valves 243f, 243g, 243h, and 243i in an open state. The N$_2$ gas acts as a purge gas so as to enhance the effect of removing from the process chamber 201 the BCl$_3$ gas remaining in the process chamber 201, which has not reacted or remains after contributing to the formation of the boron-containing layer containing Cl.

In this case, the gas remaining in the process chamber 201 may be removed incompletely and the interior of the process chamber 201 may be purged incompletely. When the gas remaining in the process chamber 201 is very small in amount, there is no adverse effect to be generated in following Step 2a. Here, an amount of the N$_2$ gas supplied into the process chamber 201 need not be a large amount. For example, approximately the same amount of the N$_2$ gas as the reaction tube 203 (or the process chamber 201) may be supplied to perform the purge such that there is no adverse effect to be generated in Step 2a. As described above, as the interior of the process chamber 201 is incompletely purged, the purge time can be reduced and the throughput can be improved. In addition, the consumption of the N$_2$ gas can also be suppressed to a minimal necessity.

The boron halide-based precursor gas may include boron trifluoride (BF$_3$) gas, boron tribromide (BBr$_3$) gas, and the like, in addition to the boron trichloride (BCl$_3$) gas. The inert gas may include a rare gas such as Ar gas, He gas, Ne gas, Xe gas, and the like, in addition to the N$_2$ gas.

[Step 2a]

(3DMAS Gas Supply)

After Step 1a is completed and the residual gas in the process chamber 201 is removed, the valve 243b of the second gas supply pipe 232b is opened to flow the 3DMAS gas into the second gas supply pipe 232b. A flow rate of the 3DMAS gas flowing in the second gas supply pipe 232b is adjusted by the mass flow controller 241b. The flow-rate-adjusted 3DMAS gas is supplied into the process chamber 201 through the gas supply holes 250b of the second nozzle 249b, and exhausted through the exhaust pipe 231. As such, the 3DMAS gas is supplied to the wafer 200 (i.e., 3DMAS gas supply). In this case, the valve 243g is opened to flow the N$_2$ gas as an inert gas into the second inert gas supply pipe 232g. A flow rate of the N$_2$ gas flowing in the second inert gas supply pipe 232g is adjusted by the mass flow controller 241g. The flow-rate-adjusted N$_2$ gas is supplied into the process chamber 201 together with the 3DMAS gas and exhausted through the exhaust pipe 231. During this operation, the valves 243f, 243h and 243i are opened to flow N$_2$ gas into the first inert gas supply pipe 232f, the third inert gas supply pipe 232h, and the fourth inert gas supply pipe 232i in order to prevent infiltration of the 3DMAS gas into the first nozzle 249a, the third nozzle 249c, the fourth nozzle 249d, and the buffer chamber 237. The N$_2$ gas is supplied into the process chamber 201 through the first gas supply pipe 232a, the third gas supply pipe 232c, the fourth gas supply pipe 232d, the first nozzle 249a, the third nozzle 249c, the fourth nozzle 249d, and the buffer chamber 237, and exhausted through the exhaust pipe 231.

In this case, the APC valve 244 is appropriately adjusted such that the internal pressure of the process chamber 201 falls within, for example, a range of 1 to 13,300 Pa, specifically, 20 to 1,330 Pa. The supply flow rate of the 3DMAS gas controlled by the mass flow controller 241b is set to fall within, for example, a range of 1 to 1,000 sccm. The supply flow rate of the $N_2$ gas controlled by each of the mass flow controllers 241f, 241g, 241h, and 241i is set to fall within, for example, a range of 100 to 10,000 sccm. The time for supplying the 3DMAS gas to the wafers 200, i.e., a gas supply time (i.e., an irradiation time), is set to fall within, for example, a range of 1 to 120 seconds, specifically, 1 to 60 seconds. In this case, similar to Step 1a, the temperature of the heater 207 is set such that the temperature of the wafers 200 falls within, for example, a range of 250 to 700 degrees C., specifically, 300 to 650 degrees C., more specifically, 350 to 600 degrees C.

By supplying the 3DMAS gas to the wafer 200 under the above-described conditions, the boron-containing layer containing Cl formed on the wafer 200 in Step 1a reacts with the 3DMAS gas. Specifically, at least a portion of Cl atoms constituting the halogen group (e.g., chloro group) in the boron-containing layer containing Cl reacts with at least a portion of ligands including the amino group in the 3DMAS gas. Accordingly, the Cl atoms constituting the halogen group (e.g., chloro group) that react with the ligands including the amino group in the 3DMAS gas are separated (or extracted) from the boron-containing layer containing Cl, and the ligands including the amino group that react with the Cl atoms constituting the halogen group (e.g., chloro group) are separated from the 3DMAS gas. Then, silicon in the 3DMAS gas from which the ligands including the amino group is separated is bonded to the boron in the boron-containing layer containing Cl. Accordingly, the boron-containing layer containing Cl is changed (or modified) into a silicon borocarbonitride layer (SiBCN layer) as a second layer containing silicon (Si), boron (B), carbon (C), and nitrogen (N). The second layer is formed to be a layer containing Si, B, C and N, for example, having a thickness from less than one atomic layer to several atomic layers.

(Residual Gas Removal)

The valve 243b of the second gas supply pipe 232b is closed to stop the supply of the 3DMAS gas. At this time, while the APC valve 244 of the exhaust pipe 231 is in an open state, the interior of the process chamber 201 is vacuum-exhausted by the vacuum pump 246 to remove from the process chamber 201 the 3DMAS gas, which has not reacted or remains after contributing to the reaction, and reaction byproducts remaining in the process chamber 201 (i.e., residual gas removal). In this operation, the valves 243f, 243g, 243h, and 243i are in an open state and the supply of the $N_2$ gas (i.e., the inert gas) into the process chamber 201 is maintained. The $N_2$ gas acts as a purge gas so as to enhance the effect of removing from the process chamber 201 the 3DMAS gas, which has not reacted or remains after contributing to the formation of the second layer, and reaction byproducts remaining in the process chamber 201.

In this case, the gas remaining in the process chamber 201 may be removed incompletely and the interior of the process chamber 201 may be purged incompletely. When the gas remaining in the process chamber 201 is very small in amount, there is no adverse effect to be generated in following Step 1a. Here, an amount of the $N_2$ gas supplied into the process chamber 201 need not be a large amount. For example, approximately the same amount of the $N_2$ gas as the reaction tube 203 (or the process chamber 201) may be supplied to perform the purge such that there is no adverse effect to be generated in Step 1a. As described above, as the interior of the process chamber 201 is purged incompletely, the purge time can be reduced and the throughput can be improved. In addition, the consumption of the $N_2$ gas can also be suppressed to a minimal necessity.

The aminosilane-based precursor gas may include an organic precursor such as tetrakis(dimethylamino)silane (Si[N(CH$_3$)$_2$]$_4$, abbreviation: 4DMAS) gas, bis(diethylamino)silane (Si[N(C$_2$H$_5$)$_2$]$_2$H$_2$, abbreviation: 2DEAS) gas, bis(tert-butylamino)silane (SiH$_2$[NH(C$_4$H$_9$)]$_2$, abbreviation: BTBAS) gas, and the like, in addition to the 3DMAS gas. The inert gas may include a rare gas such as Ar gas, He gas, Ne gas, Xe gas, and the like, in addition to the $N_2$ gas.

(Performing Predetermined Number of Times)

A cycle in which Steps 1a and 2a are performed in that order may be set as one cycle and the cycle may be performed one or more times (e.g., a predetermined number of times). As such, Steps 1a and 2a are alternately performed one or more times (e.g., a predetermined number of times) to form on the wafer 200 the silicon borocarbonitride film (SiBCN film), that is, a thin film containing silicon (Si), boron (B), carbon (C), and nitrogen (N), which has a predetermined composition and a predetermined film thickness. Further, it may be preferred that the above cycle be repeated a plurality of times. Thus, a thickness of the SiBCN layer formed per cycle may be set to be smaller than a desired film thickness, and the above cycle may be repeated a plurality of times until the desired film thickness is obtained.

In this case, ratios of individual element components in the SiBCN layer, i.e., a ratio of a silicon component, a boron component, a carbon component, and a nitrogen component, that is to say, a silicon concentration, a boron concentration, a carbon concentration, and a nitrogen concentration, may be adjusted by controlling the processing conditions such as the internal pressure of the process chamber 201 or the gas supply time in each step, thereby controlling a composition ratio in the SiBCN film.

In addition, the phrase "the cycle which is performed in that order is performed a predetermined number of times" means that the BCl$_3$ gas and then the 3DMAS gas are supplied in that order to the wafers 200 in the process chamber 201, resulting in an advantage where an incubation time in forming the SiBCN film may be reduced. As such, it is possible to reduce the time before the SiBCN layer is formed, because Cl in the BCl$_3$ gas causes nucleus formation to be promoted at an initial stage of forming the SiBCN film, i.e., an initial stage of forming the SiBCN layer. In other words, since a film forming rate of the SiBCN film can be increased, it is possible to improve the productivity of the film forming processing. If the 3DMAS gas is first supplied and then the BCl$_3$ gas is supplied, it is confirmed that the incubation time is increased and thus a total film forming rate, i.e., productivity, is decreased, as compared with the case where the BCl$_3$ gas is first supplied and then the 3DMAS gas is supplied.

In addition, when the cycle is performed a plurality of times, the phrase "a predetermined gas is supplied to the wafer 200" in each step after at least two cycles may mean that the predetermined gas is supplied to a layer formed on the wafer 200, i.e., an uppermost surface of the wafer 200, which is a laminated body. The phrase "a predetermined layer is formed on the wafer 200" may mean that the predetermined layer is formed on a layer formed on the wafer 200, i.e., an uppermost surface of the wafer 200, which is a laminated body. Also, the above-described matters are similar in respective modifications and other embodiments which will be described later.

(Purge and Return to Atmospheric Pressure)

Once the SiBCN film having the predetermined composition and the predetermined film thickness is formed, the valves 243f, 243g, 243h, and 243i are opened to supply the N₂ gas as the inert gas from the first inert gas supply pipe 232f, the second inert gas supply pipe 232g, the third inert gas supply pipe 232h, and the fourth inert gas supply pipe 232i into the process chamber 201, respectively, and exhausted through the exhaust pipe 231. The N₂ gas acts as the purge gas and the interior of the process chamber 201 is purged with the inert gas, so that the gas and reaction byproducts remaining in the process chamber 201 are removed from the process chamber 201 (i.e., purge). Subsequently, the internal atmosphere of the process chamber 201 is substituted with the inert gas (i.e., inert gas substitution), and the internal pressure of the process chamber 201 returns to the normal pressure (i.e., return to atmospheric pressure).

(Boat Unloading and Wafer Discharging)

Thereafter, the seal cap 219 is lowered by the boat elevator 115 to open the lower end of the reaction tube 203, and the processed wafers 200 supported by the boat 217 is unloaded to the outside of the reaction tube 203 through the lower end of the reaction tube 203 (i.e., boat unload). Then, the processed wafers 200 are discharged from the boat 217 (i.e., wafer discharge).

(3) Effects According to the Present Embodiment

According to the embodiment, one or more effects may be achieved as described below.

According to the film forming sequence of the present embodiment, as the cycle including Steps 1a and 2a is performed a predetermined number of times, a SiBCN film having a high resistance to hydrogen fluoride (HF) and a low dielectric constant can be formed on the wafer 200 in a low temperature range while achieving high productivity, as compared with a conventional SiCN film, SiOCN film, or the like. Thus, a thin film having an improved resistance to HF and a reduced dielectric constant, which are in a trade-off relationship, can be formed in a low temperature range while achieving high productivity.

In addition, according to the film forming sequence of the present embodiment, the aminosilane-based precursor gas (e.g., 3DMAS gas) having high reactivity with the chloro group such as Cl is used in Step 2a. Accordingly, since the first layer containing the chloro group (Cl) and the second precursor gas may be allowed to efficiently react with each other in Step 2a, the second layer (SiBCN layer) containing Si, B, C, and N can efficiently be formed. Thus, it is possible to improve the productivity of the film forming processing of the SiBCN film. In addition, intensive studies of the inventors prove that (i) an aminosilane-based gas and a boron halide such as boron trichloride react with each other, (ii) reactivity between an aminosilane-based gas and a boron halide such as boron trichloride is increased under certain conditions, (iii) a SiBCN film having proper characteristics can be efficiently formed by such reaction, or the like.

In addition, according to the film forming sequence of the present embodiment, using two kinds of gases, i.e., the precursor gas (e.g., BCl₃ gas) containing boron and Cl functioning as a boron source and the aminosilane-based precursor gas (e.g., 3DMAS gas) functioning as a silicon source, nitrogen source, and carbon source, the SiBCN film containing silicon, boron, nitrogen, and carbon can be formed. Thus, a silicon source, a boron source, a nitrogen source, and a carbon source need not be separately supplied in forming a film. Accordingly, since the time required for each cycle can be reduced, it is possible to more improve the productivity of the film forming processing.

In addition, according to the film forming sequence of the present embodiment, as the first layer containing Cl and the 3DMAS gas are allowed to react with each other in Step 2a, at least a portion of impurities such as Cl can be extracted or desorbed from the first layer, at least a portion of the ligands including the amino group in the 3DMAS gas can be separated from the 3DMAS gas, and the boron in the first layer is bonded to the silicon in the 3DMAS gas from which at least the portion of the ligands including the amino group is separated, so as to form the second layer, resulting in that the second layer may be formed with few impurities. Accordingly, since it is possible to reduce an impurity concentration in the SiBCN film formed by performing the cycle including Steps 1a and 2a a predetermined number of times, the resistance to HF of the SiBCN film can be more improved.

In addition, according to the film forming sequence of the present embodiment, since the first layer containing Cl (i.e., the boron-containing layer containing Cl) is formed on the wafer 200 by supplying the boron halide-based precursor in Step 1a and the second layer (i.e., the SiBCN layer) is then formed by supplying the aminosilane-based precursor gas and thus modifying the first layer containing Cl in Step 2a, it is possible to adjust a boron concentration, a nitrogen concentration, and a carbon concentration in the second layer to desired values. Accordingly, since it is possible to easily control the compositions in the SiBCN film formed by performing the cycle including Steps 1a and 2a one or more times (e.g., a predetermined number of times), the SiBCN film having desired characteristics can be formed.

In addition, according to the film forming sequence of the present embodiment, since the cycle performing Steps 1a and 2a in that order is performed a predetermined number of times, the incubation time in forming the SiBCN film can be reduced. As such, it is possible to reduce the time before the SiBCN layer is formed because Cl in the BCl₃ gas causes nucleus formation to be promoted at an initial stage of forming the SiBCN film, i.e., an initial stage of forming the SiBCN layer. Thus, since a film forming rate of the SiBCN film can be increased, it is possible to improve the productivity of the film forming processing. In addition, when the 3DMAS gas is first supplied and then the BCl₃ gas is supplied, the incubation time is increased and thus a total film forming rate, i.e., productivity, is decreased, as compared with the case where the BCl₃ gas is first supplied and then the 3DMAS gas is supplied.

Further, as the boron concentration or the carbon concentration in the SiBCN film is adjusted, it becomes possible to control resistance of the SiBCN film against HF or hot phosphoric acid. For example, a wet etching rate (WER) of the SiBCN film to HF can be decreased more than that of a SiN film (that is, the resistance to HF can be increased more than that of a SiN film) by increasing the boron concentration and the carbon concentration in the SiBCN film, while the WER of the SiBCN film to HF can be increased more than that of a SiN film (that is, the resistance to HF can be decreased more than that of a SiN film) by lowering the boron concentration and the carbon concentration in the film. Also, as the boron concentration in the film is increased or decreased, a change in resistance to hot phosphoric acid would tend to show behavior different from a change in resistance to HF, and as the carbon concentration in the film is increased or decreased, a change in resistance to hot phosphoric acid would tend to show behavior similar to a change in resistance to HF. Accordingly, a WER of the SiBCN film to hot phosphoric acid can be increased more than that of a SiN film (that is, the resistance to hot phosphoric acid can be decreased more than that of a SiN film) by increasing the boron concentration in the SiBCN film, while the WER of the SiBCN film to hot phosphoric acid can be decreased more than that of a SiN film (that is, the resistance to hot phosphoric acid can be increased more than that of a SiN film) by decreasing the boron concentration in the film. Also, the WER of the SiBCN film to hot phosphoric acid can be decreased more than that of a SiN film (that is, the resistance to hot phosphoric acid can be increased more than that of a SiN film) by increasing the carbon concentration in the SiBCN film, while the WER of the SiBCN film to hot phosphoric acid can be increased more than that of a SiN film (that is, the resistance to hot phosphoric acid can be decreased more than that of a SiN film) by decreasing the carbon concentration in the film.

(Modification)

Figure 5B:
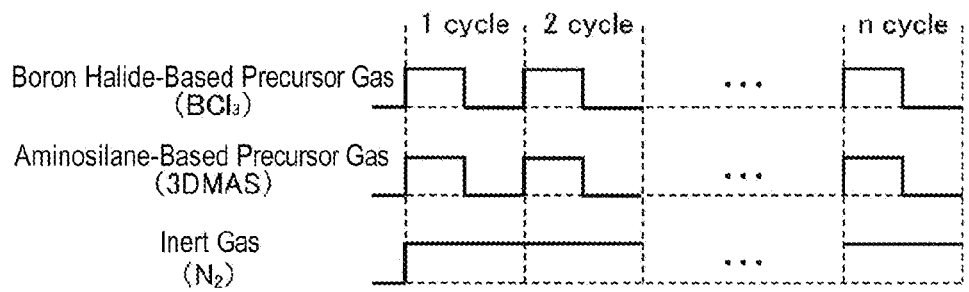
Figure 5C:
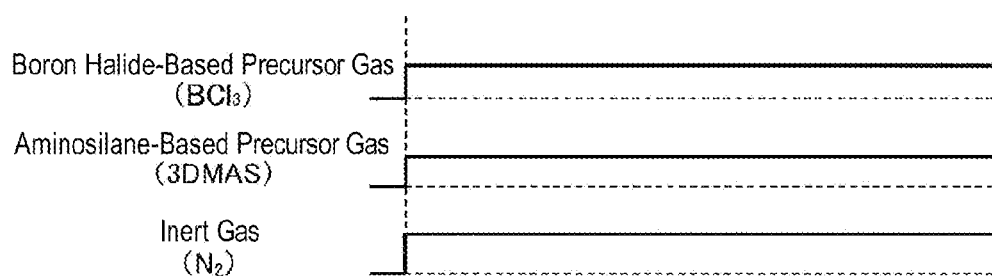

In the above film forming sequence shown in FIGS. 4 and 5A, an example is described in which the SiBCN film is formed on the wafer 200 by performing one or more times (e.g., a predetermined number of times) a cycle in which Steps 1a and 2a are alternately performed, i.e., by alternately supplying the first precursor gas and the second precursor gas, but the embodiment is not limited thereto. For example, the SiBCN film may be formed on the wafer 200 by performing one or more times (e.g., a predetermined number of times) a cycle in which Steps 1a and 2a are simultaneously performed, i.e., by simultaneously supplying the first precursor gas and the second precursor gas. FIG. 5B illustrates an example in which Steps 1a and 2a are simultaneously performed in a cycle and the cycle is performed a plurality of times (e.g., n times), and FIG. 5C illustrates an example in which Steps 1a and 2a are simultaneously performed in a cycle and the cycle is performed once. In the film forming sequence shown in FIG. 5B, the film thickness of the SiBCN film formed on the wafer 200 may be controlled mainly by adjusting the number of times the cycle is performed. Also, in the film forming sequence shown in FIG. 5C, the film thickness of the SiBCN film formed on the wafer 200 may be controlled mainly by adjusting the time for which the cycle is performed (that is to say, the time for which the gases are supplied). The processing conditions in those examples may be the same as those in the above-described film forming sequence as described with reference to FIGS. 4 and 5A.

Although the first precursor gas and the second precursor gas are supplied to the wafers 200 in the process chamber 201 not sequentially but simultaneously as described above, the same functional effects as the above-described embodiment are obtained. However, as in the above-described embodiment, it may be preferred that the first precursor gas and the second precursor gas be sequentially supplied, i.e., the first precursor gas and the second precursor gas be alternately supplied while purging of the process chamber 201 is performed therebetween, because the first precursor gas and the second precursor gas can properly react under conditions where surface reaction is dominant and the controllability of the film thickness can be increased.

Second Embodiment of the Present Disclosure

A second embodiment of the present disclosure will be described below.

In the first embodiment, an example in described in which a thin film containing silicon, boron, carbon, and nitrogen (e.g., SiBCN film) is formed on a substrate by performing a cycle including Steps 1a and 2a a predetermined number of times. In contrast, the present embodiment describes, for example, that a thin film containing silicon, boron, and nitrogen (e.g., SiBN film) or a thin film containing silicon, boron, carbon, and nitrogen (e.g., SiBCN film) is formed on a substrate by performing a predetermined number of times a cycle including Steps 1b and 2b, which are performed in the same manner as above-described Steps 1a and 2a, and performing additional Step 3b for supplying a nitriding gas (e.g., $NH_3$ gas) as a reaction gas to a substrate.

In the film formation sequence of this embodiment, a thin film containing a predetermined element, boron, and nitrogen, or a thin film containing a predetermined element, boron, carbon, and nitrogen that has a low carbon concentration is formed on a substrate by performing a cycle a predetermined number of times, the cycle performing in the following order: supplying a first precursor gas containing boron and a halogen group to the substrate; supplying a second precursor gas containing the predetermined element and an amino group to the substrate; and supplying a reaction gas to the substrate, the reaction gas being different from the first precursor gas and the second precursor gas.

As such, a thin film containing a predetermined element, boron, and nitrogen, or a thin film containing a predetermined element, boron, carbon, and nitrogen that has a carbon concentration lower than a second layer (which will be described later) is formed on a substrate by performing a cycle a predetermined number of times, the cycle performing in the following order: forming a first layer containing boron and a halogen group by supplying a first precursor gas containing boron and the halogen group to the substrate; forming the second layer containing the predetermined element, boron, carbon, and nitrogen by supplying a second precursor gas containing the predetermined element and an amino group to the substrate and modifying the first layer; and forming a third layer containing the predetermined element, boron, and nitrogen, or a third layer containing the predetermined element, boron, carbon, and nitrogen that has a carbon concentration lower than the second layer by supplying a reaction gas different from the first and the second precursor gases to the substrate and modifying the second layer.

In addition, supplying the first precursor gas and supplying the second precursor gas are performed in the same manner as described above with reference to the first embodiment. Thus, forming the first layer and forming the second layer are performed in the same manner as described above with reference to the first embodiment.

In forming the third layer, the second layer is modified by nitriding the second layer using a nitriding gas as the reaction gas. Specifically, nitrogen is further provided to the second layer. In addition, at least a portion of carbon in the second layer is separated (or extracted) from the second layer by nitriding the second layer.

Further, according to the present embodiment, in forming the third layer, a layer containing silicon, boron, and nitrogen (e.g., silicon boronitride layer) is formed as the third layer containing the predetermined element, boron, and nitrogen, or a layer containing silicon, boron, carbon, and nitrogen (e.g., silicon borocarbonitride layer) is formed as the third layer containing the predetermined element, boron, carbon, and nitrogen. In addition, the above cycle is performed a predetermined number of times, so as to form a thin film containing silicon, boron, and nitrogen (e.g., silicon boronitride film) as the thin film containing the predetermined element, boron, and nitrogen, or to form a thin film containing silicon, boron, carbon, and nitrogen (e.g., silicon borocarbonitride film) as the thin film containing the predetermined element, boron, carbon, and nitrogen.

(First Film Forming Sequence)

Figure 6:
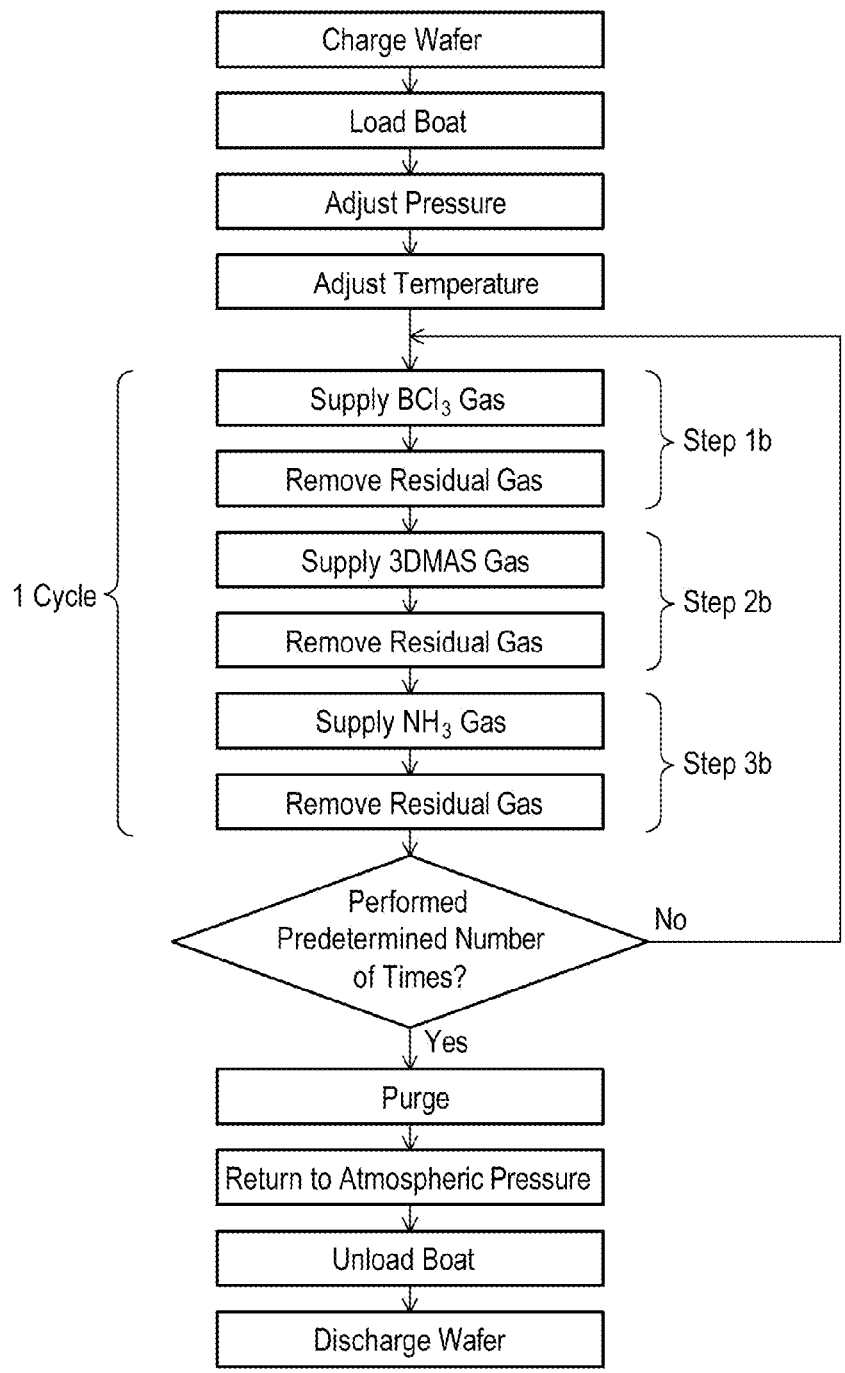
Figure 7A:
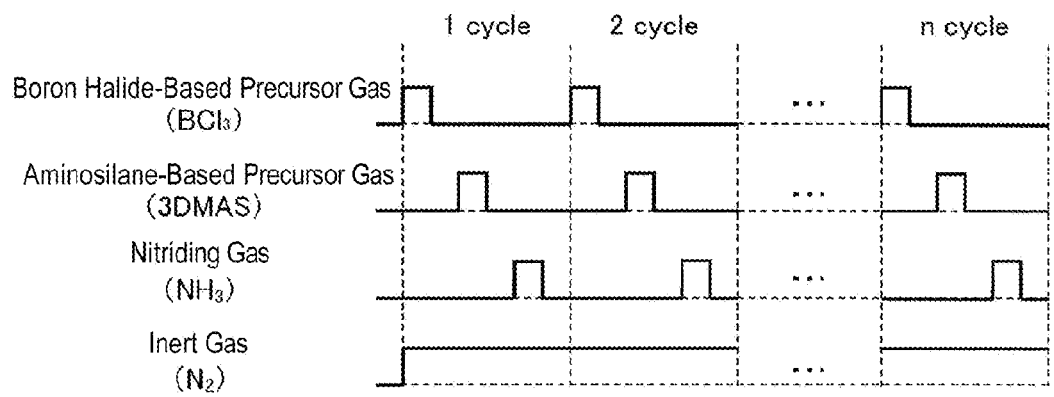
FIG. 7A illustrates an example of a sequence of timings for gas supply in which a film is formed under non-plasma conditions, in the first film forming sequence according to the second embodiment of the present disclosure.
Figure 7B:
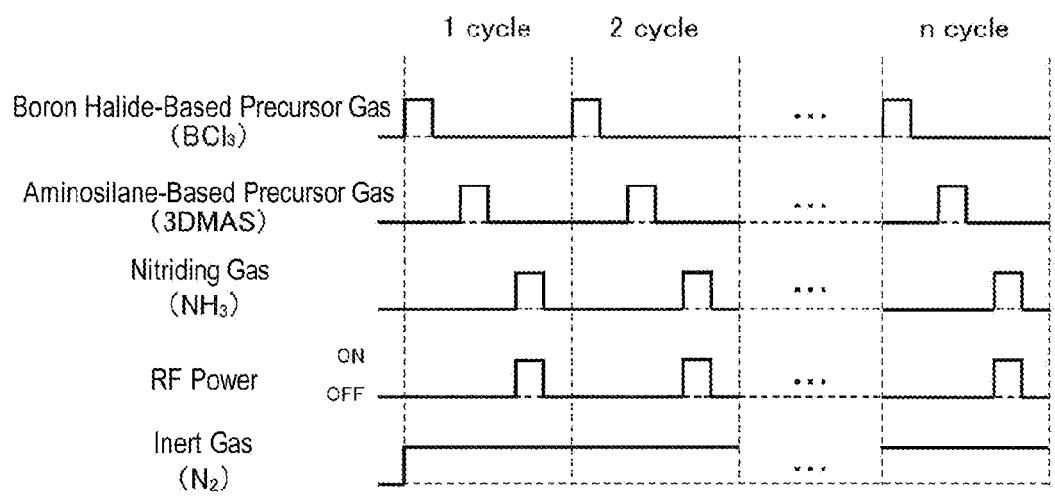
FIG. 7B illustrates an example of a sequence of timings for gas supply and RF (Radio Frequency) power supply in which a film is formed using plasma, in the first film forming sequence according to the second embodiment of the present disclosure.

A first film forming sequence (hereinafter, simply referred to as a first sequence) of the present embodiment is described below. FIG. 6 illustrates a flowchart of film forming in the first sequence according to the present embodiment. FIGS. 7A and 7B illustrate examples of sequences of timings for gas supply and high-frequency (or radio frequency (RF)) power supply in the first sequence of the present embodiment. FIG. 7A illustrates an example in which a film is formed under non-plasma conditions and FIG. 7B illustrates an example in which a film is formed using plasma.

In the first sequence of the present embodiment, a silicon boronitride film (SiBN film) as a thin film containing silicon, boron, and nitrogen, or a silicon borocarbonitride film (SiBCN film) having a carbon concentration lower than a second layer (which will be described later) as a thin film containing silicon, boron, carbon, and nitrogen having a carbon concentration lower than the second layer is formed on the wafer 200 in the process chamber 201 by performing a cycle a predetermined number of times, the cycle performing in the following order: forming a boron-containing layer containing chlorine (i.e., boron-containing layer containing Cl) as a first layer containing boron and a chloro group (e.g., chlorine) by supplying a boron halide-based precursor gas containing boron and the chloro group to the wafer 200; forming a silicon borocarbonitride layer (SiBCN layer) as the second layer containing silicon, boron, carbon, and nitrogen by supplying an aminosilane-based precursor gas containing silicon and an amino group to the wafer 200 and modifying the first layer; and forming a silicon boronitride layer (SiBN layer) as a third layer containing silicon, boron, and nitrogen, or a silicon borocarbonitride layer (SiBCN layer) having a carbon concentration lower than the second layer as a third layer containing silicon, boron, carbon, and nitrogen having a carbon concentration lower than the second layer by supplying a nitriding gas as a reaction gas to the wafer 200 and modifying the second layer.

The first sequence of the present embodiment is different from the film forming sequence of the first embodiment as Step 3b is performed in addition to Steps 1b and 2b which are performed in the same manner as Steps 1a and 2a, while the other steps are performed similarly to those in the film forming sequence of the first embodiment. Step 3b in the present embodiment is described below. Also, in the following descriptions, $NH_3$ gas is used as an example of the nitriding gas in Step 3b.

[Step 3b]
($NH_3$ Gas Supply)

After Step 2b is completed and the residual gas in the process chamber 201 is removed, the valve 243c of the third gas supply pipe 232c is opened to flow the $NH_3$ gas into the third gas supply pipe 232c. A flow rate of the $NH_3$ gas flowing in the third gas supply pipe 232c is adjusted by the mass flow controller 241c. The flow-rate-adjusted $NH_3$ gas is supplied into the buffer chamber 237 through the gas supply holes 250c of the third nozzle 249c. Here, if no high-frequency power (i.e., RF power) is applied between the first rod-shaped electrode 269 and the second rod-shaped electrode 270, the $NH_3$ gas supplied into the buffer chamber 237 is thermally activated, supplied into the process chamber 201 through the gas supply holes 250e, and then exhausted through the exhaust pipe 231 (see FIG. 7A). In contrast, if high-frequency power is applied between the first rod-shaped electrode 269 and the second rod-shaped electrode 270 from the high-frequency power source 273 through the matcher 272, the $NH_3$ gas supplied into the buffer chamber 237 is plasma-excited, supplied as an active species into the process chamber 201 through the gas supply holes 250e, and then exhausted through the exhaust pipe 231 (see FIG. 7B). In this manner, the $NH_3$ gas which is heat-activated or plasma-activated is supplied to the wafers 200. In this case, the valve 243h is opened to flow $N_2$ gas into the third inert gas supply pipe 232h. The $N_2$ gas is supplied into the process chamber 201 together with the $NH_3$ gas, and exhausted through the exhaust pipe 231. During this operation, the valves 243f, 243g, and 243i are opened to flow $N_2$ gas into the first inert gas supply pipe 232f, the second inert gas supply pipe 232g, and the fourth inert gas supply pipe 232i in order to prevent infiltration of the $NH_3$ gas into the first nozzle 249a, the second nozzle 249b, and the fourth nozzle 249d. The $N_2$ gas is supplied into the process chamber 201 through the first gas supply pipe 232a, the second gas supply pipe 232b, the fourth gas supply pipe 232d, the first nozzle 249a, the second nozzle 249b, and the fourth nozzle 249d, and exhausted through the exhaust pipe 231.

When the $NH_3$ gas is thermally activated (not plasma-excited), the APC valve 244 is appropriately adjusted such that the internal pressure of the process chamber 201 falls within, for example, a range of 1 to 3,000 Pa. The internal pressure of the process chamber 201 is set to fall within a relatively high pressure range so as to allow the $NH_3$ gas to be thermally activated under non-plasma conditions. In addition, when the $NH_3$ gas is thermally activated and supplied, it is possible to generate a relatively soft reaction so as to perform the nitriding more softly, which will be described later. The partial pressure of the $NH_3$ gas in the process chamber 201 is set to fall within, for example, a range of 0.01 to 2,970 Pa. The supply flow rate of the $NH_3$ gas controlled by the mass flow controller 241c is set to fall within, for example, a range of 100 to 10,000 sccm. The supply flow rate of the $N_2$ gas controlled by each of the mass flow controllers 241h, 241f, 241g, and 241i is set to fall within, for example, a range of 100 to 10,000 sccm. The time for supplying the thermally activated $NH_3$ gas to the wafers 200, in other words, a gas supply time (i.e., an irradiation time), is set to fall within, for example, a range of 1 to 120 seconds, specifically, 1 to 60 seconds. In this case, the temperature of the heater 207 is set such that the temperature of the wafers 200 falls within, for example, a range of 250 to 700 degrees C., specifically, 300 to 650 degrees C., more specifically, 350 to 600 degrees C., in the same manner as Steps 1b and 2b.

When the $NH_3$ gas is plasma-excited and supplied as an active species, the APC valve 244 is appropriately adjusted such that the internal pressure of the process chamber 201 falls within, for example, a range of 1 to 100 Pa. The use of the plasma allows the $NH_3$ gas to be activated although the internal pressure of the process chamber 201 is set to fall within such a relatively low pressure range. The partial pressure of the $NH_3$ gas in the process chamber 201 is set to fall within, for example, a range of 0.01 to 100 Pa. The supply flow rate of the $NH_3$ gas controlled by the mass flow controller 241c is set to fall within, for example, a range of 100 to 10,000 sccm. The supply flow rate of the $N_2$ gas controlled by each of the mass flow controllers 241h, 241f, 241g, and 241i is set to fall within, for example, a range of 100 to 10,000 sccm. The time for supplying the active species obtained by plasma-exciting the $NH_3$ gas to the wafers 200, i.e., a gas supply time (i.e., an irradiation time), is set to fall within, for example, a range of 1 to 120 seconds, specifically, 1 to 60 seconds. In this case, the temperature of the heater 207 is set such that a temperature of the wafer 200 falls within, for example, a range of 250 to 700 degrees C., specifically, 300 to 650 degrees C., more specifically, 350 to 600 degrees C., in the same manner as Steps 1b and 2b. The high-frequency power applied between the first rod-shaped electrode 269 and the second rod-shaped electrode 270 from the high-frequency power source 273 is set to fall within, for example, a range of 50 to 1,000 W.

Here, the gas flowing into the process chamber 201 is the $NH_3$ gas which is thermally activated by increasing the internal pressure of the process chamber 201 or the active species obtained by plasma-exciting the $NH_3$ gas, while none of the $BCl_3$ gas and the 3DMAS gas are allowed to flow in the process chamber 201. Accordingly, the $NH_3$ gas activated without a gas phase reaction or the $NH_3$ gas converted into active species reacts with at least a portion of the second layer containing Si, B, C, and N which is formed on the wafer 200 in Step 2b. Accordingly, the second layer is nitrided and modified into a third layer containing Si, B, C, and N (SiBCN layer) that has a carbon concentration lower than the second layer, or a third layer containing Si, B, and N (SiBN layer). For example, the third layer is a SiBCN or SiBN layer that has a thickness from less than one atomic layer to several atomic layers.

While the third layer is formed, nitriding the second layer using the nitriding gas modifies the second layer. Specifically, nitriding the second layer provides further nitrogen into the second layer. In addition, carbon in the second layer is at least partially separated (or extracted) from the second layer by nitriding the second layer.

In addition, as shown in FIG. 7A, with the thermally activated $NH_3$ gas which flows into the process chamber 201 to thermally nitride the second layer, the second layer can be modified (or changed) into the SiBCN or SiBN layer. Here, as at least a portion of the C component is desorbed (or extracted) from the second layer by means of the energy of the activated $NH_3$ gas while increasing the ratio of the N component in the second layer, the second layer is modified into the SiBCN or SiBN layer. In this case, an effect of thermally nitriding by the $NH_3$ gas also causes the Si—N bond to increase but the Si—C bond and the Si—Si bond to decrease in the second layer, and thus, the ratio of the C component and the ratio of the Si component in the second layer are decreased. In particular, most of the C component may be desorbed so that an amount of the C component is reduced to an impurity level. Specifically, while changing the composition ratio such that the nitrogen concentration is increased but the carbon concentration and the silicon concentration are decreased, the second layer may be modified into the SiBN layer, or the SiBCN layer having the carbon concentration lower than the second layer. Furthermore, by controlling processing conditions such as the internal pressure of the process chamber 201 and the gas supply time, the ratio of the N component in the SiBCN or SiBN layer, i.e., the nitrogen concentration, can be finely adjusted so that the composition ratio of the SiBCN or SiBN layer can be more precisely controlled.

Further, as shown in FIG. 7B, with the active species obtained by plasma-exciting the $NH_3$ gas which flows into the process chamber 201 to plasma-nitride the second layer, the second layer can be modified (or changed) into the SiBCN or SiBN layer. Here, as at least a portion of the C component is desorbed (or extracted) from the second layer by means of the energy of the active species while increasing the ratio of the N component in the second layer, the second layer is modified into the SiBCN or SiBN layer. In this case, an effect of plasma-nitriding by the $NH_3$ gas also causes the Si—N bond to increase but the Si—C bond and the Si—Si bond to decrease in the second layer, and the ratio of the C component and the ratio of the Si component in the second layer are decreased. In particular, most of the C component may be desorbed so that an amount of the C component is reduced to an impurity level or substantially disappear. Specifically, while changing the composition ratio such that the nitrogen concentration is increased but the carbon concentration and the silicon concentration are decreased, the second layer can be modified into the SiBN layer, or the SiBCN layer having the carbon concentration lower than the second layer. Furthermore, by controlling processing conditions such as the internal pressure of the process chamber 201 and the gas supply time, the ratio of the N component in the SiBCN or SiBN layer, i.e., the nitrogen concentration can be finely adjusted, so that the composition ratio of the SiBCN or SiBN layer can be more precisely controlled.

At this time, the nitriding reaction of the second layer may be not saturated. For example, when the second layer having a thickness from less than one atomic layer to several atomic layers is formed in Steps 1b and 2b, the second layer may be partially nitrided. In this case, in order not to nitride the entire second layer having a thickness from less than one atomic layer to several atomic layers, the second layer is nitrided under a condition in which the nitriding reaction of the second layer is unsaturated.

In order not to saturate the nitriding reaction of the second layer, the processing conditions in Step 3b need to be the processing conditions as described above. However, it is easy not to saturate the nitriding reaction of the second layer by making the processing conditions in Step 3b to be the following processing conditions.

[When Flowing $NH_3$ Gas Thermally Activated]
Wafer Temperature: 500 to 650 degrees C.
Internal Pressure of Process Chamber: 133 to 2,666 Pa
Partial Pressure of $NH_3$ Gas: 33 to 2,515 Pa
Supply Flow Rate of $NH_3$ Gas: 1,000 to 5,000 sccm
Supply Flow Rate of $N_2$ Gas: 300 to 3,000 sccm
Supply Time of $NH_3$ Gas: 6 to 60 seconds
[When Flowing $NH_3$ Gas Plasma-Activated]
Wafer Temperature: 500 to 650 degrees C.
Internal Pressure of Process Chamber: 33 to 80 Pa
Partial Pressure of $NH_3$ Gas: 17 to 75 Pa
Supply Flow Rate of $NH_3$ Gas: 1,000 to 5,000 sccm
Supply Flow Rate of $N_2$ Gas: 300 to 1,000 sccm
Supply Time of $NH_3$ Gas: 6 to 60 seconds
(Residual Gas Removal)

Thereafter, the valve 243c of the third gas supply pipe 232c is closed to stop the supply of the $NH_3$ gas. At this time, while the APC valve 244 of the exhaust pipe 231 is in an open state, the interior of the process chamber 201 is vacuum-exhausted by the vacuum pump 246 to remove from the process chamber 201 the $NH_3$ gas, which has not reacted or remains after contributing to the formation of the third layer, and reaction byproducts remaining in the process chamber 201 (i.e., residual gas removal). In this operation, the supply of the $N_2$ gas into the process chamber 201 is maintained by keeping the valves 243h, 243f, 243g, and 243i in an open state. The $N_2$ gas acts as a purge gas so as to enhance the effect of removing from the process chamber 201 the $NH_3$ gas, which has not reacted or remains after contributing to the formation of the third layer, and reaction byproducts remaining in the process chamber 201.

In this case, the gas remaining in the process chamber 201 may be removed incompletely and the interior of the process chamber 201 may be purged incompletely. When the gas remaining in the process chamber 201 is very small in amount, there is no adverse effect to be generated in following Step 1b. Here, an amount of the $N_2$ gas supplied into the process chamber 201 need not be a large amount. For example, approximately the same amount of the $N_2$ gas as the reaction tube 203 (or the process chamber 201) may be supplied to perform the purge such that there is no adverse effect to be generated in Step 1b. As described above, as the interior of the process chamber 201 is purged incompletely, the purge time can be reduced and the throughput can be improved. In addition, the consumption of the $N_2$ gas can also be suppressed to a minimal necessity.

The nitrogen-containing gas may include diazen ($N_2H_2$) gas, hydrazine ($N_2H_4$) gas, $N_3H_8$ gas, a gas including these compounds, and the like, in addition to the $NH_3$ gas. The inert gas may include a rare gas such as Ar gas, He gas, Ne gas, Xe gas, and the like, in addition to the $N_2$ gas.

(Performing Predetermined Number of Times)

Steps 1b to 3b may be set as one cycle and the cycle may be performed one or more times (i.e., a predetermined number of times) to form on the wafer 200 a silicon boronitride film (SiBN film) or a silicon borocarbonitride film (SiBCN film) having a carbon concentration lower than the second layer, which has a predetermined composition and a predetermined film thickness, i.e., a thin film containing Si, B, and N or a thin film containing Si, B, C, and N and having a carbon concentration lower than the second layer. Further, it may be preferred that the above cycle be repeated a plurality of times. Thus, a thickness of the SiBN or SiBCN layer formed per cycle may be set to be smaller than a desired film thickness, and the above cycle may be repeated a plurality of times until the desired film thickness is obtained (Second Film Forming Sequence)

Figure 8:
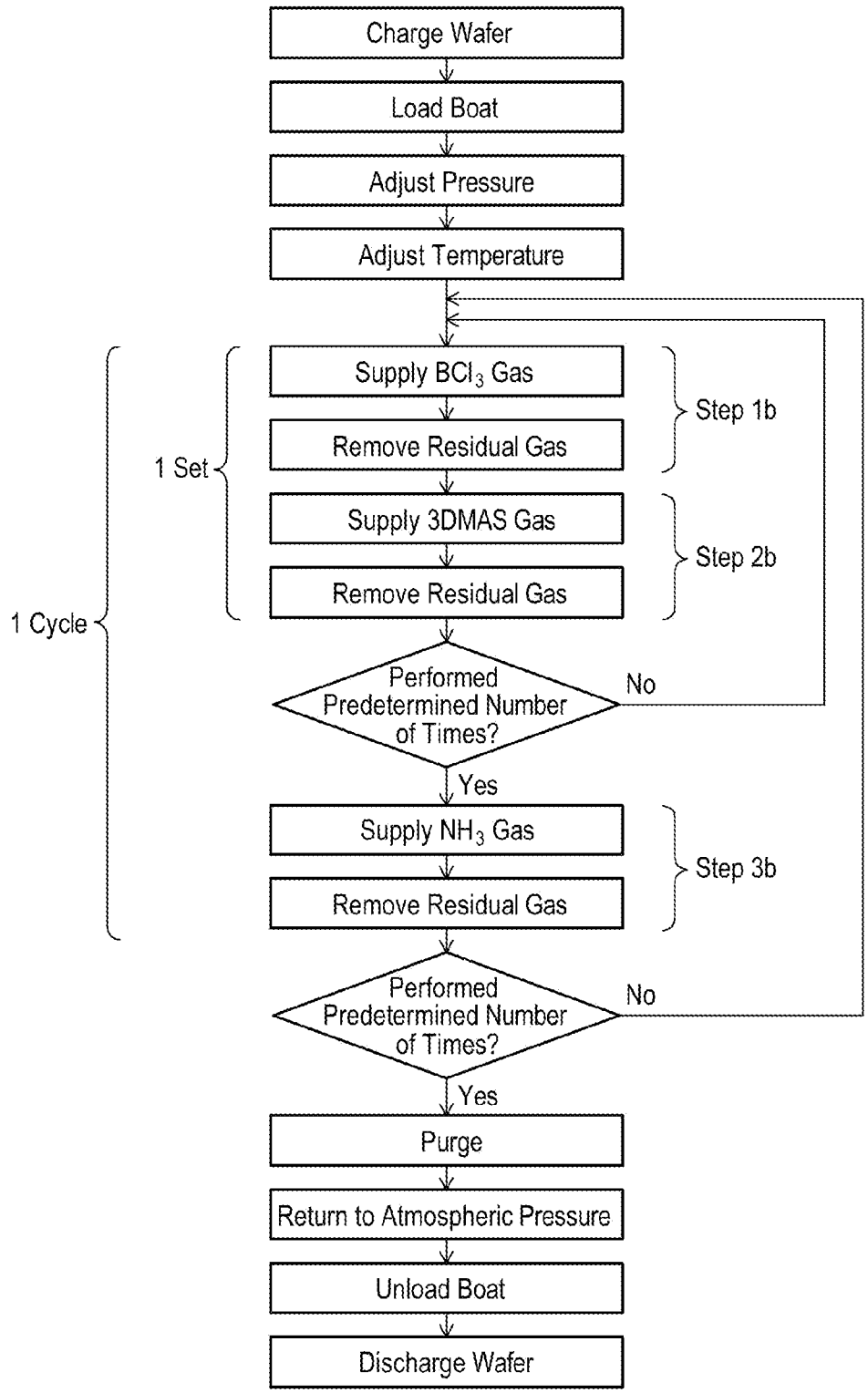
FIG. 8 illustrates a flowchart of film forming in a second film forming sequence according to the second embodiment of the present disclosure.
Figure 9A:
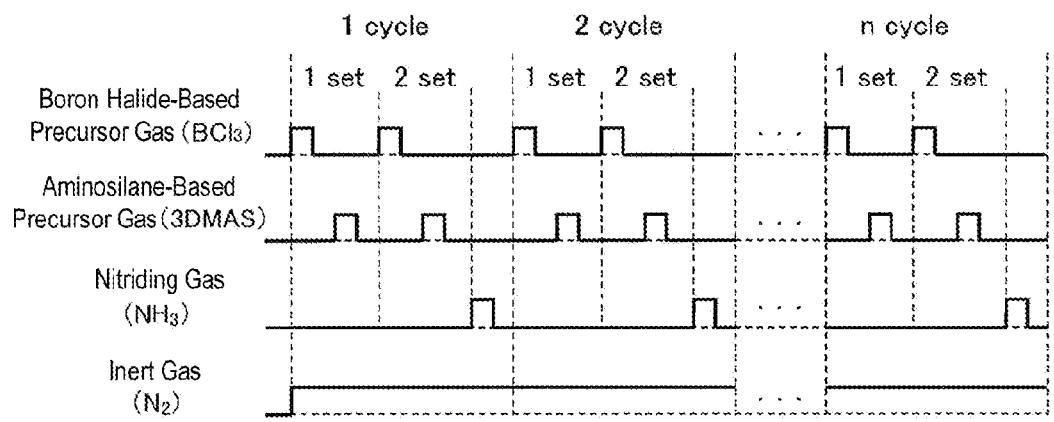
FIG. 9A illustrates an example of a sequence of timings for gas supply in which a film is formed under non-plasma conditions, in the second film forming sequence according to the second embodiment of the present disclosure.
Figure 9B:
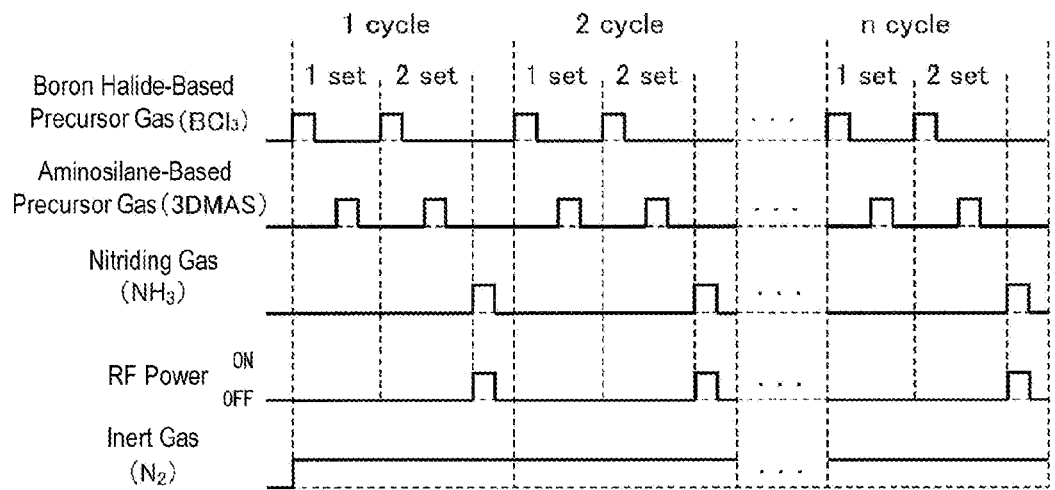
FIG. 9B illustrates an example of a sequence of timings for gas supply and RF power supply in which in which a film is formed using plasma, in the second film forming sequence according to the second embodiment of the present disclosure.

A second film forming sequence (hereinafter, simply referred to as a second sequence) of the second embodiment is described below. FIG. 8 illustrates a flowchart of film forming in the second sequence according to the second embodiment. FIGS. 9A and 9B illustrate examples of sequences of timings for gas supply and RF power supply in the second sequence of the second embodiment. FIG. 9A illustrates an example in which a film is formed under non-plasma conditions and FIG. 9B illustrates an example in which a film is formed using plasma.

In the second sequence of the embodiment, a thin film containing a predetermined element, boron, and nitrogen, or a thin film containing a predetermined element, boron, carbon, and nitrogen having a low carbon concentration is formed on a substrate by performing a cycle a first predetermined number of times, the cycle performing in the following order: alternately performing a second predetermined number of times supplying a first precursor gas containing boron and a halogen group to the substrate and supplying a second precursor gas containing the predetermined element and an amino group to the substrate; and supplying a reaction gas different from the first and the second precursor gases to the substrate.

Specifically, a silicon boronitride film (SiBN film) as a thin film containing silicon, boron, and nitrogen, or a silicon borocarbonitride film (SiBCN film) having a carbon concentration lower than a second layer (which will be described later) as a thin film containing silicon, boron, carbon, and nitrogen that has a carbon concentration lower than the second layer is formed on the wafer 200 in the process chamber 201 by performing a cycle a first predetermined number of times, the cycle including alternately performing a second predetermined number of times (e.g., a plurality of times) forming a boron-containing layer containing chlorine (i.e., boron-containing layer containing Cl) as a first layer containing boron and a chloro group (e.g., chlorine) by supplying a boron halide-based precursor gas containing boron and the chloro group to the wafer 200 and forming a silicon borocarbonitride layer (SiBCN layer) as the second layer containing silicon, boron, carbon, and nitrogen by supplying an aminosilane-based precursor gas containing silicon and an amino group to the wafer 200 and by modifying the first layer; and forming a silicon boronitride layer (SiBN layer) as a third layer containing silicon, boron and nitrogen, or a silicon borocarbonitride layer (SiBCN layer) having a carbon concentration lower than the second layer as a third layer containing silicon, boron, carbon, and nitrogen that has a carbon concentration lower than the second layer by supplying to the wafer 200 a nitriding gas as a reaction gas to nitride and modify the second layer.

As such, in the sequence, Steps 1b and 2b of the first sequence are set as one set and after the set is repeated a plurality of times, Step 3b is performed. In addition, a cycle in which the set of Steps 1b and 2b is repeated and Step 3b is then performed a predetermined number of times so as to form on the wafer 200 the SiBN film or the SiBCN film having a carbon concentration lower than the second layer, which has a predetermined composition and a predetermined film thickness. FIGS. 9A and 9B show examples in which Steps 1b and 2b are set as one set and after the set is performed twice, Step 3b is performed. In those examples, a cycle in which the set of Steps 1b and 2b is repeated twice and Step 3b is then performed is performed n times (here, n is an integer), so as to form on the wafer 200 the SiBN film or the SiBCN film having a carbon concentration lower than the second layer, which has a predetermined composition and a predetermined film thickness. In addition, the second sequence is different from the first sequence in that Steps 1b and 2b are set as one set and the set is repeated a plurality of times before Step 3b is performed, and the others may be performed in the same manner as those in the first sequence. The processing conditions of the second sequence may also be the same as the processing conditions of the above first sequence.

(Effects According to the Present Embodiment)

The film forming sequences of the present embodiment achieve effects similar to those of the first embodiment. Specifically, the SiBN or SiBCN film having a high resistance to hydrogen fluoride (HF) and a low dielectric constant, as compared with a conventional SiCN or SiOCN film, can be formed in a low temperature range while achieving high productivity. Thus, a thin film having an improved resistance to HF and a reduced dielectric constant, which are in a trade-off relationship, can be formed in a low temperature range while achieving high productivity.

In addition, according to the film forming sequences of the present embodiment, by performing Steps 1b and 2b to form the second layer on the wafer 200 and then by performing Step 3b of supplying the $NH_3$ gas to the wafer 200 in the process chamber 201, it is possible to more precisely control the composition ratio of the SiBN or SiBCN layer and accordingly to more precisely control the composition ratio of the SiBN or SiBCN film.

Also, according to the film forming sequences of the present embodiment, impurities such as Cl can be more desorbed (or extracted) from the second layer having a low impurity concentration by allowing the second layer to react with the thermally activated $NH_3$ gas or the active species obtained by plasma-exciting the $NH_3$ gas in Step 3b, thereby obtaining the third layer having a lower impurity content. Accordingly, since the impurity concentration in the SiBN or SiBCN film formed by performing a predetermined number of times the cycle including Steps 1b to 3b can be more lowered, the resistance to HF of the SiBN or SiBCN film can be more improved.

According to the film forming sequences of the embodiment, a cycle in which a set of Steps 1b and 2b is performed a predetermined number of times and then Step 3b is performed is performed a predetermined number of times. Thus, it is possible to reduce an incubation time in forming the SiBCN film. That is, it is possible to reduce the time until the SiBCN layer is formed since Cl in the BCl$_3$ gas causes core formation to be promoted at an initial stage of forming the SiBCN film, i.e., an initial stage of forming the SiBCN layer. In other words, since a film forming rate of the SiBCN film can be increased, it is possible to improve the productivity of the film forming processing.

Third Embodiment of the Present Disclosure

A third embodiment of the present disclosure is described below.

In the first embodiment, an example is described in which a thin film containing a predetermined element, boron, carbon, and nitrogen (e.g., SiBCN film) is formed on a substrate by performing a cycle including Steps 1a and 2a a predetermined number of times. In contrast, the present embodiment describes, for example, that Steps 1c and 2c are performed in the same manner as Steps 1a and 2a as described above, while the carbon-containing gas (e.g., C$_3$H$_6$ gas) is supplied simultaneously with the aminosilane-based precursor gas (e.g., 3DMAS gas) in Step 2c. As such, in Step 2c, the aminosilane-based precursor gas and the carbon-containing gas are simultaneously supplied. Hereinafter, an example is described in which a thin film containing a predetermined element, boron, carbon, and nitrogen (e.g., SiBCN film) is formed on a substrate by performing a cycle in which Steps 1c and 2c are performed in that order a predetermined number of times.

In a film forming sequence of the present embodiment, a thin film containing a predetermined element, boron, carbon, and nitrogen is formed on a substrate by performing a cycle a predetermined number of times, the cycle performing in the following order: supplying a first precursor gas containing boron and a halogen group to the substrate; and simultaneously supplying a second precursor gas containing the predetermined element and an amino group and a carbon-containing gas to the substrate.

As such, a thin film containing a predetermined element, boron, carbon, and nitrogen is formed on a substrate by performing a cycle a predetermined number of times, the cycle including forming a first layer containing boron and a halogen group by supplying a first precursor gas containing boron and the halogen group to the substrate; and forming a second layer containing the predetermined element, boron, carbon, and nitrogen by simultaneously supplying a second precursor gas containing the predetermined element and an amino group and a carbon-containing gas to the substrate and modifying the first layer.

Further, supplying the first precursor gas and supplying the second precursor gas are performed in the same manner as described above with reference to the first embodiment. Specifically, forming the first layer and forming the second layer are performed in the same manner as described above with reference to the first embodiment. In addition, supplying the carbon-containing gas is simultaneously performed with supplying the second precursor gas.

Figure 10:
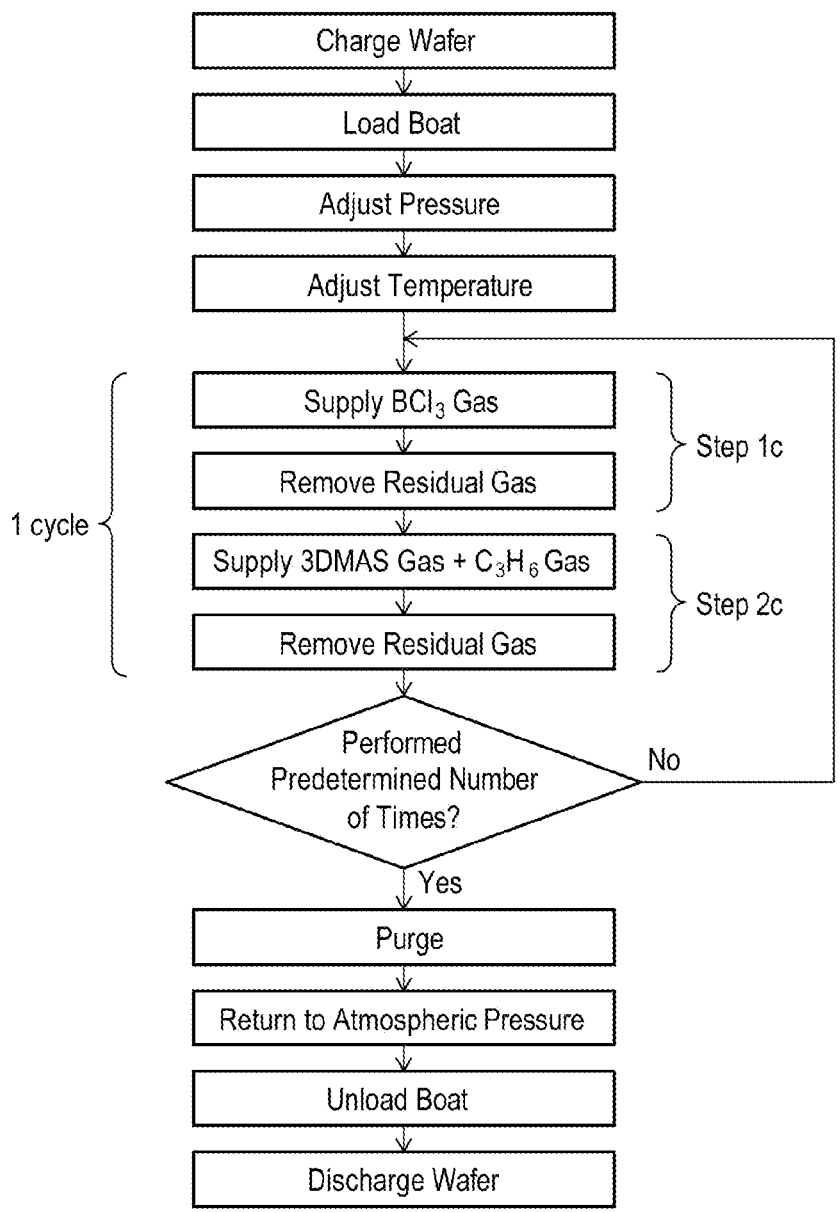
FIG. 10 illustrates a flowchart of film forming in a film forming sequence according to a third embodiment.
Figure 11A:
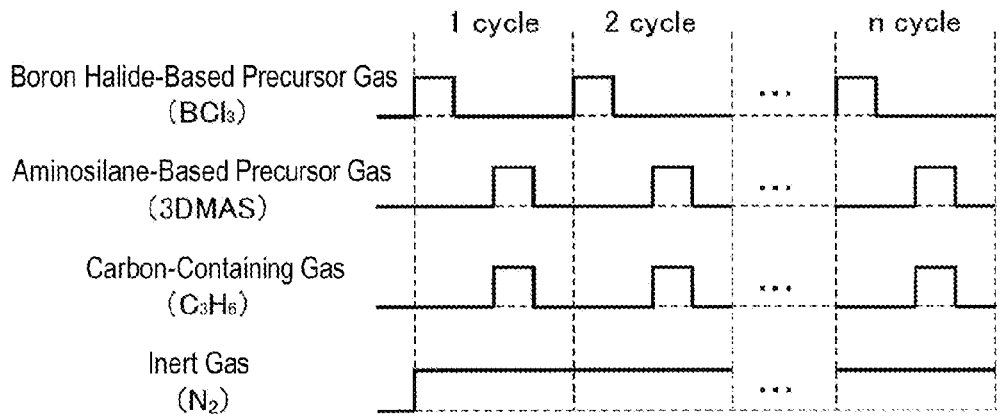
FIG. 11A illustrates gas supply timings in the film forming sequence according to the third embodiment of the present disclosure.

Hereinafter, the film forming sequence of the present embodiment is described in detail. FIG. 10 illustrates a flowchart of film forming in the film forming sequence according to the present embodiment. FIG. 11A illustrates gas supply timings in the film forming sequence of the present embodiment.

In the film forming sequence of the embodiment, a silicon borocarbonitride film (SiBCN film) as a thin film containing silicon, boron, carbon, and nitrogen is formed on the wafer 200 in the process chamber 201 by performing a cycle a predetermined number of times, the cycle including forming a boron-containing layer containing chlorine (i.e., boron-containing layer containing Cl) as a first layer containing boron and a chloro group (e.g., chlorine) by supplying a boron halide-based precursor gas containing boron and the chloro group to the wafer 200; and forming a silicon borocarbonitride layer (SiBCN layer) as a second layer containing silicon, boron, carbon, and nitrogen by simultaneously supplying an aminosilane-based precursor gas containing silicon and an amino group and a carbon-containing gas to the wafer 200 and modifying the first layer.

The film forming sequence of the present embodiment is different from the film forming sequence of the first embodiment in that the second precursor gas and the carbon-containing gas are simultaneously supplied in Step 2c, and the other steps are performed similarly to those in the film forming sequence of the first embodiment. Hereinafter, Step 2c of the present embodiment is described. In addition, herein, an example is described in which C$_3$H$_6$ gas is used as the carbon-containing gas in Step 2c.

[Step 2c]

(3DMAS Gas Supply+C$_3$H$_6$ Gas Supply)

After Step 1c is completed and the residual gas in the process chamber 201 is removed, the valve 243b of the second gas supply pipe 232b is opened to flow the 3DMAS gas into the second gas supply pipe 232b. The 3DMAS gas is supplied in the same manner as the first embodiment. In addition, the valve 243d of the fourth gas supply pipe 232d is also opened to simultaneously flow the C$_3$H$_6$ gas into the fourth gas supply pipe 232d. A flow rate of the C$_3$H$_6$ gas flowing in the fourth gas supply pipe 232d is adjusted by the mass flow controller 241d. The flow-rate-adjusted C$_3$H$_6$ gas is supplied into the process chamber 201 through the gas supply holes 250d of the fourth nozzle 249d. The C$_3$H$_6$ gas supplied into the process chamber 201 is thermally activated by and exhausted through the exhaust pipe 231. As such, the thermally activated C$_3$H$_6$ gas is supplied to the wafers 200.

In this case, the valve 243i is opened to flow N$_2$ gas into the fourth inert gas supply pipe 232i. The N$_2$ gas flowing in the fourth inert gas supply pipe 232i is supplied into the process chamber 201 together with the C$_3$H$_6$ gas, and exhausted through the exhaust pipe 231. During this operation, the valves 243f, 243g, and 243h are opened to flow N$_2$ gas into the first inert gas supply pipe 232f, the second inert gas supply pipe 232g, and the third inert gas supply pipe 232h in order to prevent infiltration of the C$_3$H$_6$ gas into the first nozzle 249a, the second nozzle 249b, the third nozzle 249c, and the buffer chamber 237. The N$_2$ gas is supplied into the process chamber 201 through the first gas supply pipe 232a, the second gas supply pipe 232b, the third gas supply pipe 232c, the first nozzle 249a, the second nozzle 249b, the third nozzle 249c, and the buffer chamber 237, and exhausted through the exhaust pipe 231.

In this case, the APC valve 244 is appropriately adjusted such that the internal pressure of the process chamber 201 falls within, for example, a range of 1 to 13,300 Pa, specifically, a range of 1 to 6,000 Pa. The supply flow rate of the C$_3$H$_6$ gas controlled by the mass flow controller 241d is set to fall within, for example, a range of 100 to 10,000 sccm. The supply flow rate of the N$_2$ gas controlled by each of the mass flow controllers 241i, 241f, 241g, and 241h is set to fall within, for example, a range of 100 to 10,000 sccm. The partial pressure of the C$_3$H$_6$ gas in the process chamber 201 is set to fall within, for example, a range of 0.01 to 5,941 Pa. The time for supplying the C$_3$H$_6$ gas to the wafers 200, in other words, a gas supply time (i.e., an irradiation time), is set to fall within, for example, a range of 1 to 120 seconds, specifically, a range of 1 to 60 seconds. In addition, similar to Step 1c, the temperature of the heater 207 is set such that the temperature of the wafers 200 falls within, for example, a range of 250 to 700 degrees C., specifically, 300 to 650 degrees C., more specifically, 350 to 600 degrees C. In addition, if the $C_3H_6$ gas is thermally activated and supplied, a soft reaction can be caused.

As such, as the $C_3H_6$ gas and the 3DMAS gas are simultaneously supplied, the boron-containing layer containing Cl as the first layer formed on the wafer 200 is modified to form the silicon borocarbonitride layer (SiBCN layer) as the second layer containing silicon, boron, carbon, and nitrogen.

(Residual Gas Removal)

Thereafter, the valve 243b of the second gas supply pipe 232b and the valve 243d of the fourth gas supply pipe 232d are closed to stop the supply of the 3DMAS gas and the $C_3H_6$ gas. At this time, while the APC valve 244 of the exhaust pipe 231 is in an open state, the interior of the process chamber 201 is vacuum-exhausted by the vacuum pump 246 to remove from the process chamber 201 the 3DMAS gas and the $C_3H_6$ gas, which have not reacted or remain after contributing to the formation of the second layer, and reaction byproducts remaining in the process chamber 201. In this operation, the supply of the $N_2$ gas (as an inert gas) into the process chamber 201 is maintained by keeping the valves 243i, 243f, 243g, and 243h in an open state. The $N_2$ gas acts as a purge gas so as to enhance the effect of removing from the process chamber 201 the 3DMAS gas and the $C_3H_6$ gas, which have not reacted or remain after contributing to the formation of the second layer, and reaction byproducts remaining in the process chamber 201.

Further, in this case, the gas remaining in the process chamber 201 may be removed incompletely and the interior of the process chamber 201 may be purged incompletely. When the gas remaining in the process chamber 201 is very small in amount, there is no adverse effect to be generated in following Step 1c. Here, an amount of the $N_2$ gas supplied into the process chamber 201 need not be a large amount. For example, approximately the same amount of the $N_2$ gas as the reaction tube 203 (or the process chamber 201) may be supplied to perform the purge such that there is no adverse effect to be generated in Step 1c. As described above, as the interior of the process chamber 201 is purged incompletely, the purge time can be reduced and the throughput can be improved. In addition, the consumption of the $N_2$ gas can also be suppressed to a minimal necessity.

The carbon-containing gas may include a hydrocarbon-based gas, such as acetylene ($C_2H_2$) gas or ethylene ($C_2H_4$) gas, in addition to the propylene ($C_3H_6$) gas. The carbon-containing gas functions as a carbon source together with the aminosilane-based precursor gas (3DMAS gas). Since a carbon-containing gas such as a hydrocarbon-based gas is used as the carbon source other than the aminosilane-based precursor gas, it is easy to control a ratio of a carbon component in the SiBCN film to be increased as compared with when the aminosilane-based precursor gas is solely used as the carbon source.

(Performing Predetermined Number of Times)

A cycle in which the above-described Steps 1c and 2c are performed in that order may be set as one cycle and the cycle may be performed one or more times (e.g., a predetermined number of times) to form on the wafer 200 the silicon borocarbonitride film (SiBCN film), i.e., the thin film containing Si, B, C, and N, which has a predetermined composition and a predetermined film thickness. Further, it may be preferred that the above cycle be repeated a plurality of times. Thus, a thickness of the SiBCN layer formed per cycle may be set to be smaller than a desired film thickness, and the above cycle may be repeated a plurality of times until the desired film thickness is obtained.

(Effects According to the Present Embodiment)

The film forming sequence of the present embodiment achieves effects similar to those of the first embodiment. Specifically, the SiBCN film having a high resistance to hydrogen fluoride (HF) and a low dielectric constant, as compared with a conventional SiCN or SiOCN film, can be formed in a low temperature range while achieving high productivity. Thus, a thin film having an improved resistance to HF and a reduced dielectric constant, which are in a trade-off relationship, can be formed in a low temperature range while achieving high productivity.

In addition, according to the film forming sequence of the present embodiment, the first layer containing Cl is formed on the wafer 200 and the 3DMAS gas and $C_3H_6$ gas are then simultaneously supplied to the wafer 200 in the process chamber 201 in Step 2c so that the ratio of the carbon component in the second layer, i.e., the ratio of the carbon component in the SiBCN layer, can be increased. As such, the second layer is formed to be a SiBCN layer having a carbon component increased (or adjusted) to be more than the ratio of the carbon concentration in the second layer (SiBCN layer) formed in the film forming sequence of the first embodiment, and a SiBCN film is formed on the wafer 200 to have a carbon component increased (or adjusted) to be more than the ratio of the carbon concentration in the SiBCN film formed in the film forming sequence of the first embodiment. According to the film forming sequence of the present embodiment, it is easy to control the ratio of the carbon component in the SiBCN film to be increased to be more than the ratio of the carbon concentration in the SiBCN film formed in the film forming sequence of the first embodiment.

Also, according to the film forming sequence of the present embodiment, since a cycle in which Steps 1c and 2c are performed in this order is set as one cycle and the cycle is performed a predetermined number of times, the incubation time in forming the SiBCN film can be reduced. Thus, it is possible to reduce the time before the SiBCN layer is formed, because Cl in the $BCl_3$ gas causes nucleus formation to be promoted at an initial stage of forming the SiBCN film, i.e., an initial stage of forming the SiBCN layer. As such, since a film forming rate of the SiBCN film can be increased, it is possible to improve the productivity of the film forming processing.

(Modification 1)

Figure 11B:
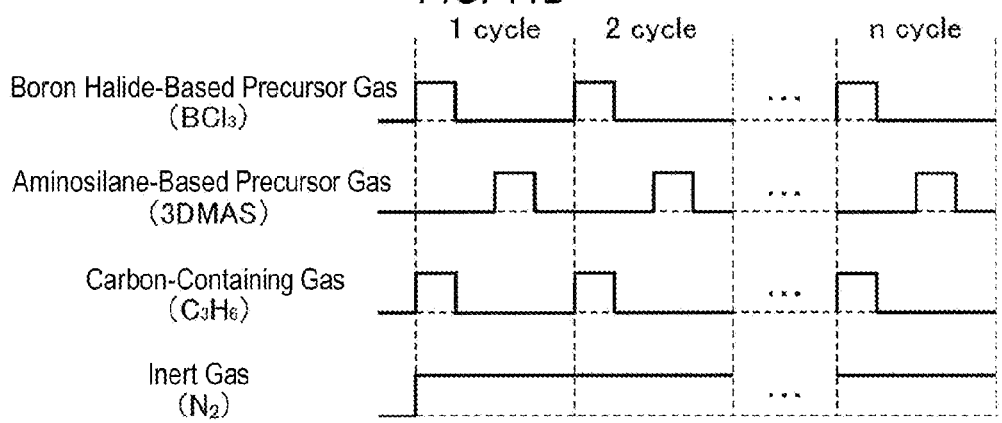
FIG. 11B illustrates a modified example of gas supply timings in the film forming sequence according to the third embodiment of the present disclosure.

In the above film forming sequence shown in FIGS. 10 and 11A, an example is described in which the SiBCN film is formed on the wafer 200 by simultaneously supplying the aminosilane-based precursor gas (e.g., 3DMAS gas) as the second precursor gas and the carbon-containing gas (e.g., $C_3H_6$ gas) in Step 2c and performing a predetermined number of times a cycle in which Steps 1c and 2c are performed in that order, but the embodiment is not limited thereto. For example, the SiBCN film may be formed on the wafer 200 by simultaneously supplying the boron halide-based precursor gas (e.g., $BCl_3$ gas) and the carbon-containing gas (e.g., $C_3H_6$ gas) in Step 1c and supplying the 3DMAS gas solely in Step 2c. FIG. 11B illustrates an example in which the boron halide-based precursor gas (e.g., $BCl_3$ gas) and the carbon-containing gas (e.g., $C_3H_6$ gas) are simultaneously supplied in Step 1c, the 3DMAS gas is solely supplied in Step 2c, and a cycle in which Steps 1c and 2c are performed in that order is performed a plurality of times (e.g., n times).

(Modification 2)

Figure 11C:
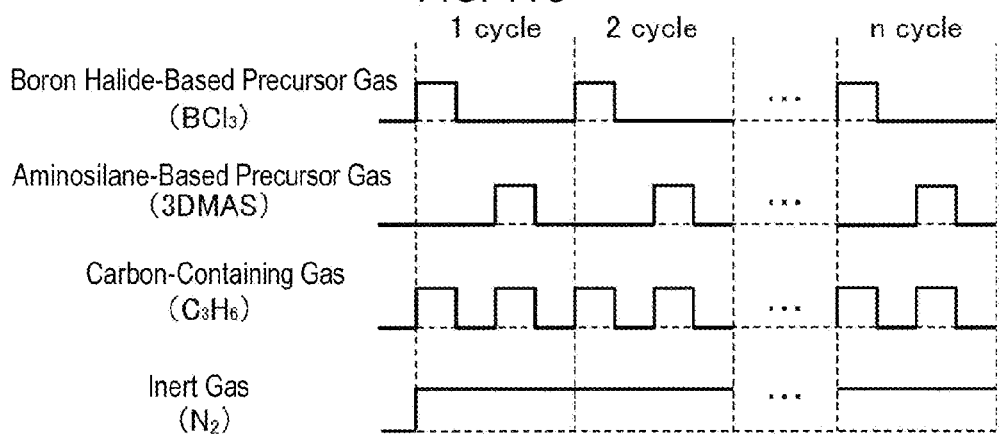
FIG. 11C illustrates another modified example of gas supply timings in the film forming sequence according to the third embodiment of the present disclosure.

Further, the SiBCN film may be formed on the wafer 200 by simultaneously supplying the boron halide-based precursor gas (e.g., $BCl_3$ gas) and the carbon-containing gas (e.g., $C_3H_6$ gas) in Step 1c and also simultaneously supplying the aminosilane-based precursor gas (e.g., 3DMAS gas) and the carbon-containing gas (e.g., $C_3H_6$ gas) in Step 2c. FIG. 11C illustrates an example in which the boron halide-based precursor gas ($BCl_3$ gas) and the carbon-containing gas ($C_3H_6$ gas) are simultaneously supplied in Step 1c, the aminosilane-based precursor gas (3DMAS gas) and the carbon-containing gas ($C_3H_6$ gas) are simultaneously supplied also in Step 2c, and a cycle in which Steps 1c and 2c are performed in that order is performed a plurality of times (e.g., n times).

As described above, not only when the second precursor gas and the carbon-containing gas are simultaneously supplied to the wafer 200 in the process chamber 201, but also when the first precursor gas and the carbon-containing gas are simultaneously supplied or when the first precursor gas and the carbon-containing gas are simultaneously supplied and the second precursor gas and the carbon-containing gas are simultaneously supplied, the same effects as the above-described embodiment are obtained. As such, the carbon-containing gas may be supplied while simultaneously at least any one of the first precursor gas and the second precursor gas is supplied.

Fourth Embodiment of the Present Disclosure

A fourth embodiment of the present disclosure is described below.

In the first embodiment, an example is described in which a thin film containing a predetermined element, boron, carbon, and nitrogen (e.g., SiBCN film) is formed on a substrate by performing a predetermined number of times a cycle including Steps 1a and 2a. In contrast, the present embodiment describes, for example, that a thin film containing a predetermined element, boron, carbon, and nitrogen (e.g., SiBCN film) is formed on a substrate by performing a predetermined number of times a cycle including Steps 1d and 2d, which are performed in the same manner as described above with reference to Steps 1a and 2a, and additional Step 3d for supplying a gas containing nitrogen and carbon (e.g., TEA gas) as a reaction gas to a substrate.

In the film formation sequence of the embodiment, a thin film containing a predetermined element, boron, carbon, and nitrogen is formed on a substrate by performing a cycle a predetermined number of times, the cycle performing in the following order: supplying a first precursor gas containing boron and a halogen group to the substrate; supplying a second precursor gas containing the predetermined element and an amino group to the substrate; and supplying a reaction gas to the substrate, the reaction gas being different from the first and the second precursor gases.

Specifically, a thin film containing a predetermined element, boron, carbon, and nitrogen is formed on a substrate by performing a cycle a predetermined number of times, the cycle including forming a first layer containing boron and a halogen group by supplying a first precursor gas containing boron and the halogen group to the substrate; forming a second layer containing the predetermined element, boron, carbon, and nitrogen by supplying a second precursor gas containing the predetermined element and an amino group to the substrate and modifying the first layer; and forming a third layer containing the predetermined element, boron, carbon, and nitrogen by supplying a gas containing nitrogen and carbon to the substrate and allowing the second layer to react with the gas containing nitrogen and carbon and to be modified to adjust a nitrogen component and a carbon component in the second layer.

(First Film Forming Sequence)

Figure 12:
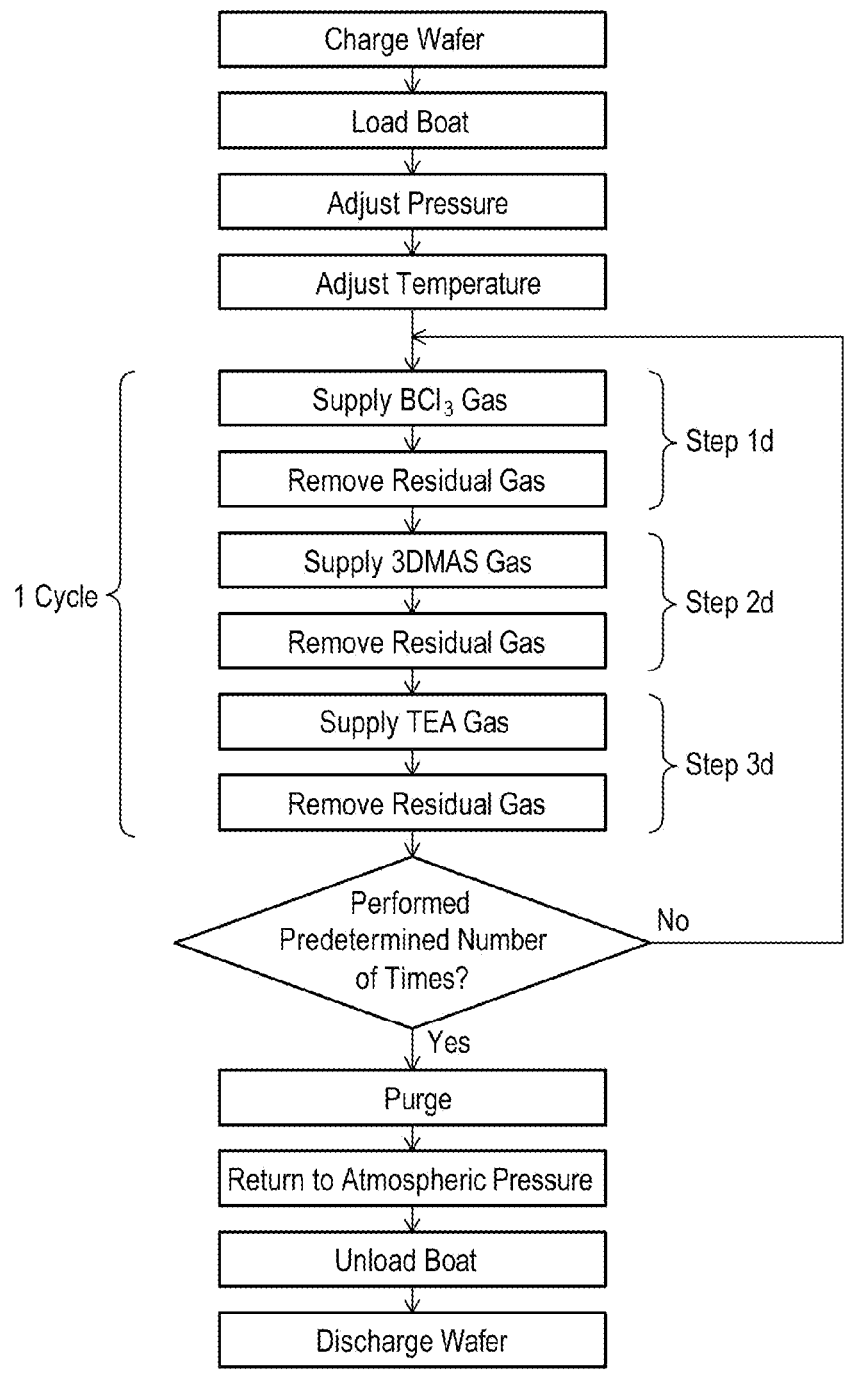
FIG. 12 illustrates a flowchart of film forming in a first film forming sequence according to a fourth embodiment of the present disclosure.
Figure 13A:
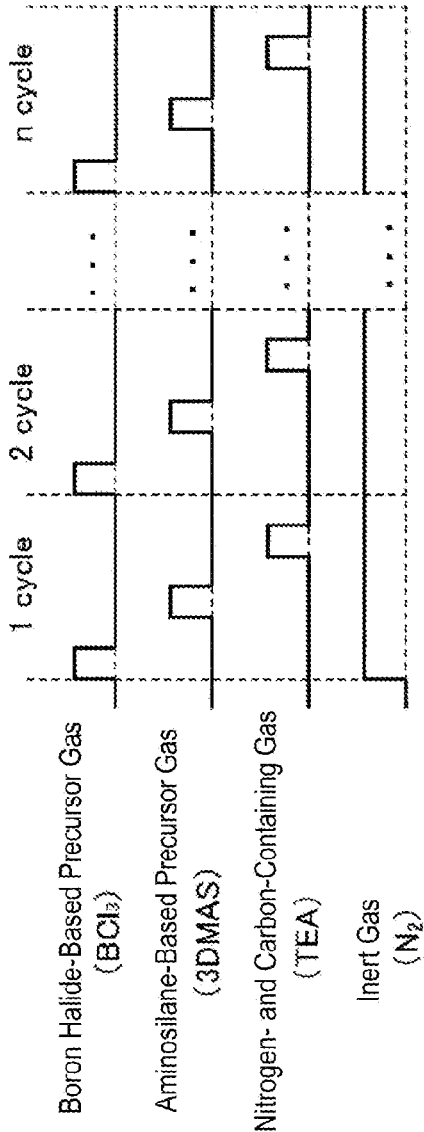
FIG. 13A illustrates gas supply timings in the first film forming sequence according to the fourth embodiment of the present disclosure.

A first film forming sequence (hereinafter, simply referred to as a first sequence) of the present embodiment is described below. FIG. 12 illustrates a flowchart of film forming in the first sequence according to the present embodiment. FIG. 13A illustrates gas supply timings in the first sequence according to the present embodiment.

In the first sequence of the embodiment, a silicon borocarbonitride film (SiBCN film) as a thin film containing silicon, boron, carbon, and nitrogen is formed on the wafer 200 in the process chamber 201 by performing a cycle a predetermined number of times, the cycle including forming a boron-containing layer containing chlorine (i.e., boron-containing layer containing Cl) as a first layer containing boron and a chloro group (e.g., chlorine) by supplying a boron halide-based precursor gas including boron and the chloro group to the wafer 200; forming a silicon borocarbonitride layer (SiBCN layer) as a second layer containing silicon, boron, carbon and nitrogen by supplying an aminosilane-based precursor gas containing silicon and an amino group to the wafer 200 and modifying the first layer; and forming a silicon borocarbonitride layer (SiBCN layer) as a third layer containing silicon, boron, carbon, and nitrogen by supplying a gas containing nitrogen and carbon to the wafer 200 and allowing the second layer to react with the gas containing nitrogen and carbon and to be modified to adjust a nitrogen component and a carbon component in the second layer.

The first sequence of the present embodiment is different from the film forming sequence of the first embodiment as Step 3d is performed in addition to Steps 1d and 2d which are performed in the same manner as described above with reference to Steps 1a and 2a, while the other steps are performed similarly to the film forming sequence in the first embodiment. Step 3d in the present embodiment is described below. Also, herein, in the following descriptions, TEA gas which is an amine-based gas is used as the gas containing nitrogen and carbon in Step 3d.

[Step 3d]

(TEA Gas Supply)

After Step 2d is completed and the residual gas in the process chamber 201 is removed, the valve 243e of the fifth gas supply pipe 232e is opened to flow the TEA gas into the fifth gas supply pipe 232e. A flow rate of the TEA gas flowing in the fifth gas supply pipe 232e is adjusted by the mass flow controller 241e. The flow-rate-adjusted TEA gas flows in the fourth gas supply pipe 232d and is supplied into the process chamber 201 through the gas supply holes 250d of the fourth nozzle 249d. The TEA gas supplied into the process chamber 201 is thermally activated and then exhausted through the exhaust pipe 231. As such, the thermally activated TEA gas is supplied to the wafer 200.

In this case, the valve 243i is opened to flow $N_2$ gas into the fourth inert gas supply pipe 232i. The $N_2$ gas flowing in the fourth inert gas supply pipe 232i is supplied into the process chamber 201 together with the TEA gas, and exhausted through the exhaust pipe 231. During this operation, the valves 243f, 243g, and 243h are opened to flow $N_2$ gas into the first inert gas supply pipe 232f, the second inert gas supply pipe 232g, and the third inert gas supply pipe 232h in order to prevent infiltration of the TEA gas into the first nozzle 249a, the second nozzle 249b, the third nozzle 249c, and the buffer chamber 237. The $N_2$ gas is supplied into the process chamber 201 through the first gas supply pipe 232a, the second gas supply pipe 232b, the third gas supply pipe 232c, the first nozzle 249a, the second nozzle 249b, the third nozzle 249c, and the buffer chamber 237, and exhausted through the exhaust pipe 231.

In this case, the APC valve 244 is appropriately adjusted such that the internal pressure of the process chamber 201 falls within, for example, a range of 1 to 6,000 Pa. The supply flow rate of the TEA gas controlled by the mass flow controller 241e is set to fall within, for example, a range of 100 to 10,000 sccm. The supply flow rate of the $N_2$ gas controlled by each of the mass flow controllers 241i, 241f, 241g and 241h is set to fall within, for example, a range of 100 to 10,000 sccm. The partial pressure of the TEA gas in the process chamber 201 is set to fall within, for example, a range of 0.01 to 5,941 Pa. The time for supplying the TEA gas to the wafers 200, in other words, a gas supply time (i.e., an irradiation time), is set to fall within, for example, a range of 1 to 200 seconds, specifically, a range of 1 to 120 seconds, more specifically, a range of 1 to 60 seconds. In this case, the temperature of the heater 207 is set such that a temperature of the wafer 200 falls within, for example, a range of 250 to 700 degrees C., specifically, 300 to 650 degrees C., more specifically, 350 to 600 degrees C., similar to Step 1d.

Here, the gas flowing in the process chamber 201 is the TEA gas thermally activated, while none of the $BCl_3$ gas and the 3DMAS gas is allowed to flow in the process chamber 201. Thus, the TEA gas activated without a gas phase reaction reacts with at least a portion of the second layer containing Si, B, C, and N formed on the wafer 200 in Step 2d. Accordingly, the second layer is modified into the third layer containing Si, B, C, and N (e.g., SiBCN layer). The third layer may be, for example, a SiBCN layer having a thickness from less than one atomic layer to several atomic layers.

While the third layer is formed, the second layer is modified by allowing the second layer and the TEA gas to react with each other. Specifically, by adding nitrogen and carbon in the TEA gas to the second layer, each of the nitrogen component and the carbon component in the modified second layer, i.e., the third layer, is increased. In addition, as the TEA gas is thermally activated and supplied to the process chamber 201, it is possible to relieve the desorption (or extraction) of the carbon component from the second layer and to easily control the ratio of the carbon component in the third layer to be increased.

(Residual Gas Removal)

Thereafter, the valve 243e of the fifth gas supply pipe 232e is closed to stop the supply of the TEA gas. At this time, while the APC valve 244 of the exhaust pipe 231 is in an open state, the interior of the process chamber 201 is vacuum-exhausted by the vacuum pump 246 to remove from the process chamber 201 the TEA gas, which has not reacted or remains after contributing to the formation of the third layer, and reaction byproducts remaining in the process chamber 201 (i.e., residual gas removal). In this operation, the supply of the $N_2$ gas (as an inert gas) into the process chamber 201 is maintained by keeping the valves 243i, 243f, 243g, and 243h in an open state. The $N_2$ gas acts as a purge gas so as to enhance the effect of removing from the process chamber 201 the TEA gas, which has not reacted or remains after contributing to the formation of the third layer, and reaction byproducts remaining in the process chamber 201.

In this case, the gas remaining in the process chamber 201 may be removed incompletely and the interior of the process chamber 201 may be purged incompletely. When the gas remaining in the process chamber 201 is very small in amount, there is no adverse effect to be generated in following Step 1d. Here, an amount of the $N_2$ gas supplied into the process chamber 201 need not be a large amount. For example, approximately the same amount of the $N_2$ gas as the reaction tube 203 (or the process chamber 201) may be supplied to perform the purge such that there is no adverse effect to be generated in Step 1d. As described above, as the interior of the process chamber 201 is purged incompletely, the purge time can be reduced and the throughput can be improved. In addition, the consumption of the $N_2$ gas can also be suppressed to a minimal necessity.

The amine-based gas may include, for example, an ethylamine-based gas obtained by vaporizing triethylamine $((C_2H_5)_3N$, abbreviation: TEA), diethylamine $((C_2H_5)_2NH$, abbreviation: DEA), monoethylamine $(C_2H_5NH_2$, abbreviation: MEA) or the like; a methylamine-based gas obtained by vaporizing trimethylamine $((CH_3)_3N$, abbreviation: TMA), dimethylamine $((CH_3)_2NH$, abbreviation: DMA), monomethylamine $(CH_3NH_2$, abbreviation: MMA) or the like; a propylamine-based gas obtained by vaporizing tripropylamine $((C_3H_7)_3N$, abbreviation: TPA), dipropylamine $((C_3H_7)_2NH$, abbreviation: DPA), monopropylamine $(C_3H_7NH_2$, abbreviation: MPA) or the like; an isopropylamine-based gas obtained by vaporizing triisopropylamine $([(CH_3)_2CH]_3N$, abbreviation: TIPA), diisopropylamine $([(CH_3)_2CH]_2NH$, abbreviation: DIPA), monoisopropylamine $((CH_3)_2CHNH_2$, abbreviation: MIPA) or the like; a butylamine-based gas obtained by vaporizing tributylamine $((C_4H_9)_3N$, abbreviation: TBA), dibutylamine $((C_4H_9)_2NH$, abbreviation: DBA), monobutylamine $(C_4H_9NH_2$, abbreviation: MBA) or the like; and an isobutylamine-based gas obtained by vaporizing triisobutylamine $([(CH_3)_2CHCH_2]_3N$, abbreviation: TIBA), diisobutylamine $([(CH_3)_2CHCH_2]_2NH$, abbreviation: DIBA), monoisobutylamine $((CH_3)_2CHCH_2NH_2$, abbreviation: MIBA) or the like. That is, the amine-based gas may include, for example, at least one of $(C_2H_5)_xNH_{3-x}$, $(CH_3)_xNH_{3-x}$, $(C_3H_7)_xNH_{3-x}$, $[(CH_3)_2CH]_xNH_{3-x}$, $(C_4H_9)_xNH_{3-x}$, $[(CH_3)_2CHCH_2]_xNH_{3-x}$ (here, x is an integer from 1 to 3 in the chemical formulae).

The amine-based gas acts as not only a nitrogen source but also a carbon source. As the amine-based gas is used as the gas containing carbon and nitrogen, it is easy to control the ratios of the carbon and nitrogen components of the SiBCN film to be increased.

In addition, a gas containing an organic hydrazine compound, i.e., an organic hydrazine-based gas, may be used as a gas containing carbon and nitrogen instead of the amine-based gas. Further, the organic hydrazine-based gas refers to a gas having a hydrazine group such as a gas obtained by vaporizing organic hydrazine, and contains carbon (C), nitrogen (N), and hydrogen (H). That is, the organic hydrazine-based gas is a silicon-free gas, and furthermore, a silicon-free and metal-free gas. The organic hydrazine-based gas may include, for example, a methylhydrazine-based gas obtained by vaporizing monomethylhydrazine $((CH_3)HN_2H_2$, abbreviation: MMH), dimethylhydrazine $((CH_3)_2N_2H_2$, abbreviation: DMH), trimethyl hydrazine $((CH_3)_2N_2 (CH_3)H$, abbreviation: TMH) or the like; and ethylhydrazine-based gas obtained by vaporizing ethylhydrazine $((C_2H_5)HN_2H_2$, abbreviation: EH) or the like. In addition, for example, when organic hydrazine in a liquid state under the normal temperature and pressure, such as MMH, is used, the organic hydrazine in a liquid state is vaporized by a vaporization system, such as a vaporizer or a bubbler, and supplied as the organic hydrazine-based gas, i.e., a gas containing carbon and nitrogen (e.g., MMH gas). In addition, a gas containing an organic hydrazine compound may also be simply referred to as an organic hydrazine compound gas or an organic hydrazine gas.

(Performing Predetermined Number of Times)

The above-described Steps 1d to 3d may be set as one cycle and the cycle may be performed one or more times (i.e., a predetermined number of times) to form on the wafer 200 a silicon borocarbonitride film (SiBCN film), i.e., a thin film containing Si, B, C and N, having a predetermined composition and a predetermined film thickness. Further, it may be preferred that the above cycle be repeated a plurality of times. Thus, a thickness of the SiBCN layer formed per cycle may be set to be smaller than a desired film thickness, and the above cycle may be repeated a plurality of times until the desired film thickness is obtained.

(Second Film Forming Sequence)

Figure 14:
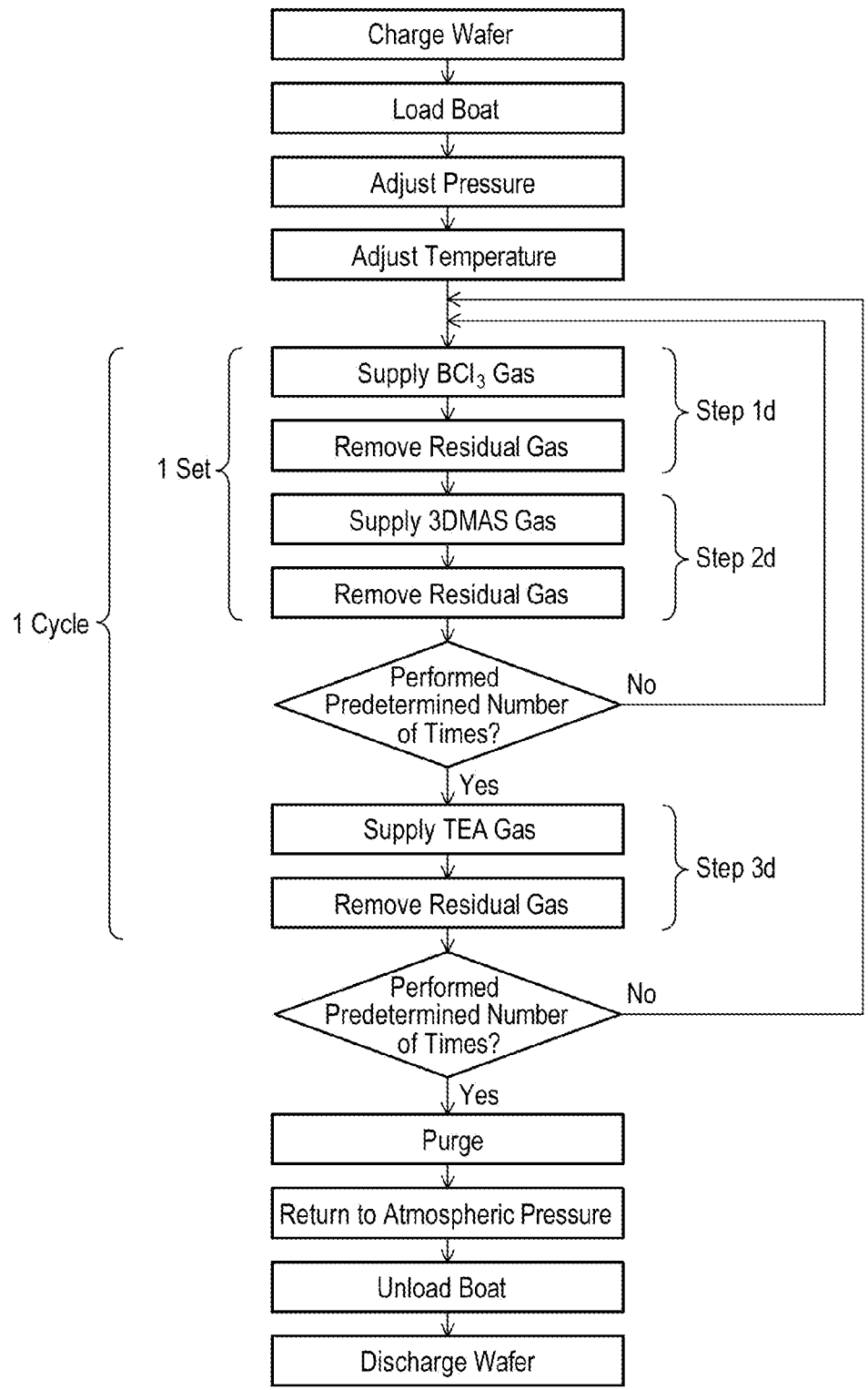
FIG. 14 illustrates a flowchart of film forming in a second film forming sequence according to the fourth embodiment of the present disclosure.

A second film forming sequence (hereinafter, simply referred to as a second sequence) of the second embodiment is described below. FIG. 14 illustrates a flowchart of film forming in the second sequence according to the present embodiment. FIG. 15A illustrates gas supply timings in the second sequence of the present embodiment.

In the second sequence of the embodiment, a thin film containing a predetermined element, boron, carbon, and nitrogen is formed on a substrate by performing a cycle a first predetermined number of times, the cycle performing in the following order: alternately performing a second predetermined number of times supplying a first precursor gas containing boron and a halogen group to the substrate and supplying a second precursor gas containing the predetermined element and an amino group to the substrate; and supplying a reaction gas different from the first and the second precursor gases to the substrate.

Specifically, a silicon borocarbonitride film (SiBCN film) as a thin film containing silicon, boron, carbon, and nitrogen is formed on the wafer 200 in the process chamber 201 by performing a cycle a first predetermined number of times, the cycle including alternately performing a second predetermined number of times (e.g., a plurality of times) forming a boron-containing layer including chlorine (i.e., boron-containing layer containing Cl) as a first layer containing boron and a chloro group (e.g., chlorine) by supplying a boron halide-based precursor gas containing boron and the chloro group to the wafer 200 and forming a silicon borocarbonitride layer (SiBCN layer) as a second layer containing silicon, boron, carbon, and nitrogen by supplying an aminosilane-based precursor gas containing silicon and an amino group to the wafer 200 and modifying the first layer; and forming a silicon borocarbonitride layer (SiBCN layer) as a third layer containing silicon, boron, carbon, and nitrogen by supplying a gas containing nitrogen and carbon to the wafer 200 and allowing the second layer to react with the gas containing nitrogen and carbon and to be modified to adjust a nitrogen component and a carbon component in the second layer.

As such, in the sequence, Steps 1d and 2d in the first sequence are set as one set and after the set is repeated a plurality of times, Step 3d is performed. In addition, a cycle in which the set of Steps 1d and 2d is repeated and Step 3d is then performed a predetermined number of times so as to form on the wafer 200 the SiBCN film having a predetermined composition and a predetermined film thickness. FIG. 15A shows an example in which Steps 1d and 2d are set as one set and the set is performed twice and 3d is then performed. In this example, for one cycle, the set of Steps 1d and 2d is repeated twice and Step 3d is then performed, and the cycle is performed n times (here, n is an integer) so as to form on the wafer 200 the SiBCN film having a predetermined composition and a predetermined film thickness. In addition, the second sequence is different from the first sequence in that Steps 1d and 2d are set as one set and the set is repeated a plurality of times before Step 3d is performed, and the others may be performed in the same manner as those in the first sequence. The processing conditions of the second sequence may also be the same as the processing conditions of the above-described first sequence.

(Effects According to the Embodiment)

The film forming sequences of the present embodiment achieve effects similar to those of the first embodiment. Specifically, the SiBCN film having a high resistance to hydrogen fluoride (HF) and a low dielectric constant, as compared with a conventional SiCN or SiOCN film, can be formed in a low temperature range while achieving high productivity. Thus, a thin film having an improved resistance to HF and a reduced dielectric constant, which are in a trade-off relationship, can be formed in a low temperature range while achieving high productivity.

In addition, according to the film forming sequence of the present embodiment, since Step 3d is performed to add nitrogen and carbon in the TEA gas to the second layer, each of the nitrogen component and the carbon component in the modified second layer, i.e., the third layer, may be increased to be more than the nitrogen component and the carbon component in the second layer. As such, the third layer can be formed to be a SiBCN layer having a nitrogen component and a carbon component increased (or adjusted) to be more than the nitrogen component and the carbon component in the second layer, and a SiBCN film is formed on the wafer 200 to have a nitrogen component and a carbon component increased (or adjusted) to be more than the nitrogen component and the carbon component in the second film. In addition, since the TEA gas is not excited by plasma but activated by heat and is supplied, it is possible to relatively relieve the desorption (or extraction) of a carbon component from the second layer and to easily control a ratio of a carbon component in the third layer, i.e., the SiBCN film, to be increased.

(Modification)

Figure 13B:
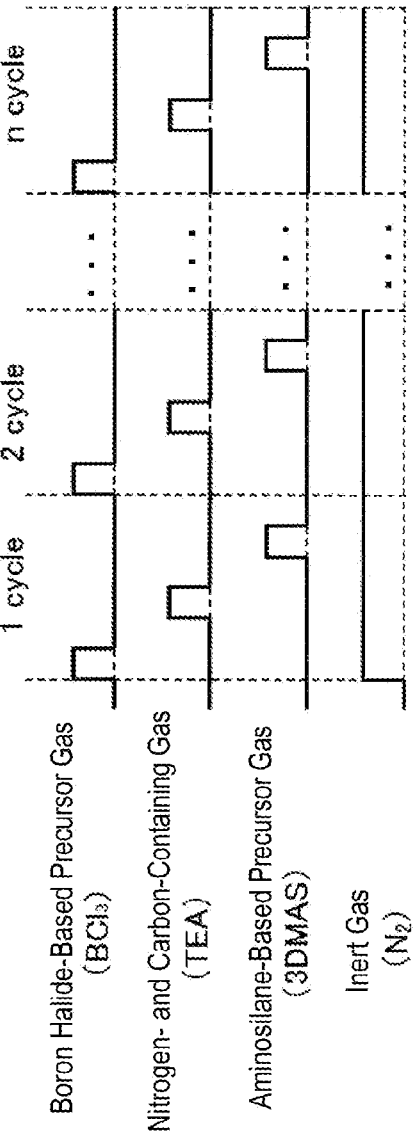
FIG. 13B illustrates a modified example of gas supply timings in the first film forming sequence according to the fourth embodiment of the present disclosure.

In the first and the second sequences, Step 2d for supplying the second precursor gas (e.g., 3DMAS gas) is performed and then Step 3d for supplying the gas containing carbon and nitrogen (e.g., TEA gas) is performed, but the present disclosure is not limited to such embodiments. That is, the present disclosure is not limited to the case that Step 2d is performed prior to Step 3d, but Step 3d may be performed prior to Step 2d. For example, as shown in FIG. 13B, a cycle in which Steps 1d, 3d, and 2d are performed in that order is set as one cycle and the cycle may be performed one or more times (e.g., a predetermined number of times) so as to form on the wafer 200 a silicon borocarbonitride film (SiBCN film) having a predetermined composition and a predetermined film thickness. In addition, for example, as shown in FIG. 15B, Steps 1d and 3d are set as one set, and after the set is repeated a plurality of times, Step 2d is performed. In this example, a cycle in which the set of Steps 1d and 3d are repeated and Step 2d is then performed may be performed a predetermined number of times so as to form on the wafer 200 a SiBCN film having a predetermined composition and a predetermined film thickness.

In addition, when Step 1d is performed before Step 3d, the first layer (i.e., the boron-containing layer containing Cl) formed in Step 1d reacts with the TEA gas. Accordingly, the first layer (i.e., the boron-containing layer containing Cl) is changed (i.e., modified) into a layer containing B, Cl, C, and N (BCN layer containing Cl). Also, the BCN layer containing Cl is formed to be a layer containing B, Cl, Cl and N, for example, having a thickness from less than one atomic layer to several atomic layers. The BCN layer containing Cl is also formed to be a layer having a relatively large ratio of the B component and a relatively large ratio of the C component, i.e., a B-rich and C-rich layer.

Further, when Step 3d is performed before Step 2d, the BCN layer containing Cl formed in Step 3d reacts with the 3DMAS gas. Accordingly, the BCN layer containing Cl is changed (i.e., modified) into the second layer containing Si, B, C, and N, i.e., the silicon borocarbonitride layer (SiBCN layer).

Thus, a cycle in which Steps 1d, 3d, and 2d are performed in that order may be performed a predetermined number of times, or a cycle in which a set of Steps 1d and 3d is repeated a plurality of times and Step 2d is then performed may be performed a predetermined number of times, so as to form on the wafer 200 a SiBCN film having a predetermined composition and a predetermined film thickness.

Additional Embodiments of the Present Disclosure

Hereinabove, various embodiments of the present disclosure has been specifically described, but the present disclosure is not limited to the above-described embodiments, and may be variously modified without departing from the spirit of the present disclosure.

For example, in the above-described embodiments, while an example in which in each sequence, one kind of thin film (single-layered film) is formed on a wafer in the process chamber at a time has been described, a laminated film of two or more kinds of thin films may be formed on a wafer in the process chamber at a time by appropriately combine the above-described respective sequences. For example, as the film formation sequence of the first, third, or fourth embodiment and the film formation sequence of the second embodiment are alternately performed in-situ in the process chamber, a laminated film having the SiBCN film and the SiBN film alternately laminated may be formed.

In this manner, the present disclosure may be preferably applied to formation of not only a single-layered film but also a laminated film, in which functional effects similar to the above-described embodiments are obtained.

In addition, as the SiBCN or SiBN film formed according to the above-described embodiments may be used as a sidewall spacer, a device forming technique having a small leak current and good machinability can be provided.

Also, as the SiBCN or SiBN film formed by the method according to the above-described embodiments may be used as an etching stopper layer, a device forming technique having good machinability can be provided.

Also, according to the above-described embodiments, a SiBCN or SiBN film having an ideal stoichiometric mixture ratio can be formed without using plasma in a low temperature range. In addition, since such a SiBCN or SiBN film can be formed without using plasma, for example, application to a process having probability of plasma damage, for example, an SADP film of DPT, is also possible.

In addition, in the above-described embodiments, while an example in which the silicon-based insulating film (e.g., SiBCN or SiBN film) containing silicon, which is a semiconductor element, is formed as a borocarbonitride film or a boronitride film is described, the present disclosure may be applied to a case in which a metal-based thin film containing a metal element such as titanium (Ti), zirconium (Zr), hafnium (Hf), tantalum (Ta), aluminum (Al), molybdenum (Mo), or the like is formed.

For example, the present disclosure may be applied to a case in which a titanium borocarbonitride film (TiBCN film), a titanium boronitride film (TiBN film), a Ti-based thin film which is obtained by combining or mixing the above films, or a laminated film thereof is formed.

Also, for example, the present disclosure may be applied to a case in which a zirconium borocarbonitride film (ZrBCN film), a zirconium boronitride film (ZrBN film), a Zr-based thin film which is obtained by combining or mixing the above films, or a laminated film thereof is formed.

Also, for example, the present disclosure may be applied to a case in which a hafnium borocarbonitride film (HfBCN film), a hafnium boronitride film (HfBN film), a Hf-based thin film which is obtained by combining or mixing the above films, or a laminated film thereof is formed.

Further, for example, the present disclosure may be applied to a case in which a tantalum borocarbonitride film (TaBCN film), a tantalum boronitride film (TaBN film), a Ta-based thin film which is obtained by combining or mixing the above films, or a laminated film thereof is formed.

Furthermore, for example, the present disclosure may be applied to a case in which an aluminum borocarbonitride film (AlBCN film), an aluminum boronitride film (AlBN film), an Al-based thin film which is obtained by combining or mixing the above films, or a laminated film thereof is formed.

Moreover, for example, the present disclosure may be applied to a case in which a molybdenum borocarbonitride film (MoBCN film), a molybdenum boronitride film (MoBN film), a Mo-based thin film which is obtained by combining or mixing the above films, or a laminated film thereof is formed.

As described above, the present disclosure may also be applied to formation of not only the silicon-based thin film but also the metal-based thin film, in which functional effects similar to the above-described embodiments are obtained.

As such, the present disclosure may be applied to a case in which the thin film containing a predetermined element such as a semiconductor element or a metal element is formed.

Moreover, while an example in which the thin film is formed using a batch type substrate processing apparatus where a plurality of substrates are processed at a time is described, the present disclosure is not limited thereto but may be applied to a case in which the thin film is formed using a single-wafer type substrate processing apparatus where one or several substrates are processed at a time.

Although examples of the above-described embodiments in which the substrate processing apparatus having the hot wall type processing furnace is used to form a thin film, the present disclosure is not limited thereto but may be appropriately applied to a case where a substrate processing apparatus having a cold wall type processing furnace is used to form a thin film.

Moreover, the above-described embodiments, modifications, application examples and the like may be appropriately combined and used.

For example, although an example of the third embodiment is described in which the $BCl_3$ gas or the 3DMAS gas is supplied simultaneously with the carbon-containing gas (e.g., $C_3H_6$ gas), the present disclosure is not limited thereto. For example, when the nitriding gas (e.g., $NH_3$ gas) is supplied in the second embodiment, the carbon-containing gas (e.g., $C_3H_6$ gas) may be supplied simultaneously, and when the amine-based gas (e.g., TEA gas) containing nitrogen and carbon is supplied in the fourth embodiment, the carbon-containing gas ($C_3H_6$ gas) may be supplied simultaneously.

In addition, the present disclosure may be implemented by modifying, for example, an existing process recipe of the substrate processing apparatus. When the process recipe is modified, the process recipe according to the present disclosure may be installed to the substrate processing apparatus through an electrical communication line or a recording medium in which the process recipe is recorded, or the process recipe itself may be changed to the process recipe according to the present disclosure by manipulating an input/output device of the substrate processing apparatus.

Further Additional Aspects of the Present Disclosure

Hereinafter, some aspects of the present disclosure are additionally stated.

(Supplementary Note 1)

According to an aspect of the present disclosure, there is provided a method of manufacturing a semiconductor device, including forming a thin film containing a predetermined element, boron, carbon, and nitrogen on a substrate by performing a cycle a predetermined number of times, the cycle including forming a first layer containing boron and a halogen group by supplying a first precursor gas containing boron and the halogen group to the substrate; and forming a second layer containing the predetermined element, boron, carbon, and nitrogen by supplying a second precursor gas containing the predetermined element and an amino group to the substrate and modifying the first layer.

(Supplementary Note 2)

In another aspect of the present disclosure, in forming the second layer, the first layer reacts with the second precursor gas to extract, from the first layer, at least a portion of atoms constituting the halogen group in the first layer and separate, from the second precursor gas, at least a portion of ligands including the amino group in the second precursor gas.

(Supplementary Note 3)

In another aspect of the present disclosure, in forming the second layer, the first layer reacts with the second precursor gas to extract, from the first layer, at least a portion of atoms constituting the halogen group in the first layer, separate, from the second precursor gas, at least a portion of ligands including the amino group in the second precursor gas, and bond the boron in the first layer and the predetermined element in the second precursor gas from which at least the portion of ligands are separated.

(Supplementary Note 4)

In another aspect of the present disclosure, the cycle includes supplying a reaction gas to the substrate, the reaction gas being different from the first precursor gas and the second precursor gas.

(Supplementary Note 5)

In another aspect of the present disclosure, the cycle includes modifying the second layer by supplying a reaction gas to the substrate, the reaction gas being different from the first precursor gas and the second precursor gas.

(Supplementary Note 6)

In another aspect of the present disclosure, there is provided a method of manufacturing a semiconductor device, including forming a thin film containing a predetermined element, boron, and nitrogen, or a thin film containing a predetermined element, boron, carbon, and nitrogen having a carbon concentration lower than a second layer (which will be described later) on a substrate by performing a cycle a first predetermined number of times, the cycle including forming a first layer containing boron and a halogen group by supplying a first precursor gas containing boron and the halogen group to the substrate; forming the second layer containing the predetermined element, boron, carbon, and nitrogen by supplying a second precursor gas containing the predetermined element and an amino group to the substrate and modifying the first layer; and forming a third layer containing the predetermined element, boron and nitrogen, or a third layer containing the predetermined element, boron, carbon, and nitrogen having a carbon concentration lower than the second layer by supplying a reaction gas different from the first and the second precursor gases to the substrate and modifying the second layer.

(Supplementary Note 7)

In another aspect of the present disclosure, the reaction gas includes a nitriding gas.

(Supplementary Note 8)

In another aspect of the present disclosure, the reaction gas includes a nitriding gas activated by heat.

(Supplementary Note 9)

In another aspect of the present disclosure, the reaction gas includes a nitriding gas activated by plasma.

(Supplementary Note 10)

In another aspect of the present disclosure, the reaction gas includes a gas containing nitrogen and carbon.

(Supplementary Note 11)

In another aspect of the present disclosure, in forming the thin film by performing the cycle the first predetermined number of times, the cycle performs in the following order: alternately performing the act of forming the first layer and the act of forming the second layer a second predetermined number of times; and the act of forming the third layer.

(Supplementary Note 12)

In another aspect of the present disclosure, in forming the first layer, a carbon-containing gas is supplied to the substrate together with the first precursor gas.

(Supplementary Note 13)

In another aspect of the present disclosure, in forming the second layer, a carbon-containing gas is supplied to the substrate together with the second precursor gas.

(Supplementary Note 14)

In another aspect of the present disclosure, in forming the third layer, a carbon-containing gas is supplied to the substrate together with the reaction gas.

(Supplementary Note 15)

According to still another aspect of the present disclosure, there is provided a method of processing a substrate, including forming a thin film containing a predetermined element, boron, carbon, and nitrogen on the substrate by performing a cycle a predetermined number of times, the cycle including forming a first layer containing boron and a halogen group by supplying a first precursor gas containing boron and the halogen group to the substrate; and forming a second layer containing the predetermined element, boron, carbon, and nitrogen by supplying a second precursor gas containing the predetermined element and an amino group to the substrate and modifying the first layer.

(Supplementary Note 16)

According to yet another aspect of the present disclosure, there is provided a method of processing a substrate, including forming a thin film containing a predetermined element, boron, and nitrogen, or a thin film containing a predetermined element, boron, carbon, and nitrogen having a carbon concentration lower than a second layer (which will be described later) on the substrate by performing a cycle a predetermined number of times, the cycle including forming a first layer containing boron and a halogen group by supplying a first precursor gas containing boron and the halogen group to the substrate; forming the second layer containing the predetermined element, boron, carbon, and nitrogen by supplying a second precursor gas containing the predetermined element and an amino group to the substrate and modifying the first layer; and forming a third layer containing the predetermined element, boron, and nitrogen, or a third layer containing the predetermined element, boron, carbon, and nitrogen having a carbon concentration lower than the second layer by supplying a reaction gas different from the first and the second precursor gases to the substrate and modifying the second layer.

(Supplementary Note 17)

According to yet another aspect of the present disclosure, there is provided a substrate processing apparatus, including a process chamber in which processing to a substrate is performed; a first precursor gas supply system configured to supply a first precursor gas containing boron and a halogen group into the process chamber; a second precursor gas supply system configured to supply a second precursor gas containing a predetermined element and an amino group into the process chamber; a control part configured to control the first precursor gas supply system and the second precursor gas supply system such that a thin film containing the predetermined element, boron, carbon, and nitrogen is formed on the substrate in the process chamber by performing a cycle a predetermined number of times, wherein the cycle includes forming a first layer containing boron and the halogen group by supplying the first precursor gas to the substrate; and forming a second layer containing the predetermined element, boron, carbon, and nitrogen by supplying the second precursor gas to the substrate and modifying the first layer.

(Supplementary Note 18)

According to yet another aspect of the present disclosure, there is provided a substrate processing apparatus, including a process chamber in which processing to a substrate is performed; a first precursor gas supply system configured to supply a first precursor gas containing boron and a halogen group into the process chamber; a second precursor gas supply system configured to supply a second precursor gas containing a predetermined element and an amino group into the process chamber; a reaction gas supply system configured to supply a reaction gas different from the first and the second precursor gases into the process chamber; a control part configured to control the first precursor gas supply system, the second precursor gas supply system and the reaction gas supply system such that a thin film containing the predetermined element, boron, and nitrogen, or a thin film containing the predetermined element, boron, carbon, and nitrogen having a carbon concentration lower than a second layer (which will be described later) is formed on the substrate in the process chamber by performing a cycle a predetermined number of times, the cycle including forming a first layer containing boron and the halogen group by supplying the first precursor gas to the substrate; forming the second layer containing the predetermined element, boron, carbon, and nitrogen by supplying the second precursor gas to the substrate and modifying the first layer; forming a third layer containing the predetermined element, boron and nitrogen, or a third layer containing the predetermined element, boron, carbon, and nitrogen having a carbon concentration lower than the second layer by supplying the reaction gas to the substrate and modifying the second layer.

(Supplementary Note 19)

According to yet another aspect of the present disclosure, there is provided a program that causes a computer to perform a process of forming a thin film containing a predetermined element, boron, carbon, and nitrogen on a substrate in a process chamber of a substrate processing apparatus by performing a cycle a predetermined number of times, the cycle including forming a first layer containing boron and a halogen group by supplying a first precursor gas containing boron and the halogen group to the substrate; and forming a second layer containing the predetermined element, boron, carbon, and nitrogen by supplying a second precursor gas containing the predetermined element and an amino group to the substrate and modifying the first layer.

(Supplementary Note 20)

According to yet another aspect of the present disclosure, there is provided a program that causes a computer to perform a process of forming a thin film containing a predetermined element, boron, and nitrogen, or a thin film containing a predetermined element, boron, carbon, and nitrogen having a carbon concentration lower than a second layer (which will be described later) on a substrate in a process chamber of a substrate processing apparatus by performing a cycle a predetermined number of times, the cycle including forming a first layer containing boron and a halogen group by supplying a first precursor gas containing boron and the halogen group to the substrate; forming the second layer containing the predetermined element, boron, carbon, and nitrogen by supplying a second precursor gas containing the predetermined element and an amino group to the substrate and modifying the first layer; and forming a third layer containing the predetermined element, boron, and nitrogen, or a third layer containing the predetermined element, boron, carbon, and nitrogen having a carbon concentration lower than the second layer by supplying a reaction gas different from the first and the second precursor gases to the substrate and modifying the second layer.

(Supplementary Note 21)

According to yet another aspect of the present disclosure, there is provided a non-transitory computer-readable recording medium storing a program that causes a computer to perform a process of forming a thin film containing a predetermined element, boron, carbon, and nitrogen on a substrate in a process chamber of a substrate processing apparatus by performing a cycle a predetermined number of times, the cycle including forming a first layer containing boron and a halogen group by supplying a first precursor gas containing boron and the halogen group to the substrate; and forming a second layer containing the predetermined element, boron, carbon, and nitrogen by supplying a second precursor gas containing the predetermined element and an amino group to the substrate and modifying the first layer.

(Supplementary Note 22)

According to yet another aspect of the present disclosure, there is provided a non-transitory computer-readable recording medium storing a program that causes a computer to perform a process of forming a thin film containing a predetermined element, boron, and nitrogen, or a thin film containing a predetermined element, boron, carbon, and nitrogen having a carbon concentration lower than a second layer (which will be described later) on a substrate in a process chamber of a substrate processing apparatus by performing a cycle a predetermined number of times, the cycle including forming a first layer containing boron and a halogen group by supplying a first precursor gas containing boron and the halogen group to the substrate; forming the second layer containing the predetermined element, boron, carbon, and nitrogen by supplying a second precursor gas containing the predetermined element and an amino group to the substrate and modifying the first layer; and forming a third layer containing the predetermined element, boron, and nitrogen, or a third layer containing the predetermined element, boron, carbon, and nitrogen having a carbon concentration lower than the second layer by supplying a reaction gas different from the first and the second precursor gases to the substrate and modifying the second layer.

According to the present disclosure in some embodiments, there may be provided a method of manufacturing a semiconductor device, a substrate processing apparatus, and a recording medium, which make it possible to form a thin film having a high resistance to HF and a low dielectric constant in a low temperature range with high productivity.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising forming a thin film containing a predetermined element, boron, carbon, and nitrogen on a substrate by performing a cycle a first predetermined number of times, the cycle comprising:

forming a first layer containing boron and a halogen group by supplying a first precursor gas containing boron and the halogen group to the substrate;

forming a second layer containing the predetermined element, boron, carbon, and nitrogen by supplying a second precursor gas containing the predetermined element and an amino group to the substrate and modifying the first layer; and supplying a reaction gas to the substrate, the reaction gas being different from the first precursor gas and the second precursor gas.

2. A method of manufacturing a semiconductor device, comprising forming a thin film containing a predetermined element, boron, carbon, and nitrogen on a substrate by performing a cycle a first predetermined number of times, the cycle comprising:

forming a first layer containing boron and a halogen group by supplying a first precursor gas containing boron and the halogen group to the substrate;

forming a second layer containing the predetermined element, boron, carbon, and nitrogen by supplying a second precursor gas containing the predetermined element and an amino group to the substrate and modifying the first layer;

modifying the second layer by supplying a reaction gas to the substrate, the reaction gas being different from the first precursor gas and the second precursor gas.

3. A method of manufacturing a semiconductor device, comprising forming a thin film containing a predetermined element, boron, carbon, and nitrogen on a substrate by performing a cycle a first predetermined number of times, the cycle comprising:

forming a first layer containing boron and a halogen group by supplying a first precursor gas containing boron and the halogen group to the substrate;

forming a second layer containing the predetermined element, boron, carbon, and nitrogen by supplying a second precursor gas containing the predetermined element and an amino group to the substrate and modifying the first layer; and forming a third layer having a carbon concentration lower than a carbon concentration of the second layer by supplying a reaction gas to the substrate and modifying the second layer, the reaction gas being different from the first precursor gas and the second precursor gas.

4. The method of claim 1, wherein the reaction gas includes a nitriding gas.

5. The method of claim 1, wherein the reaction gas includes a nitriding gas activated by heat.

6. The method of claim 1, wherein the reaction gas includes a nitriding gas activated by plasma.

7. The method of claim 1, wherein the reaction gas includes a gas containing nitrogen and carbon.

8. The method of claim 3, wherein in the act of forming the thin film by performing the cycle the first predetermined number of times, the cycle performs in the following order:

alternately performing the act of forming the first layer and the act of forming the second layer a second predetermined number of times; and the act of forming the third layer.

9. The method of claim 1, wherein in the act of forming the first layer, a carbon-containing gas is supplied to the substrate together with the first precursor gas.

10. The method of claim 1, wherein in the act of forming the second layer, a carbon-containing gas is supplied to the substrate together with the second precursor gas.

11. The method of claim 1, wherein in the act of supplying the reaction gas, a carbon-containing gas is supplied to the substrate together with the reaction gas.

12. A non-transitory computer-readable recording medium storing a program that causes a computer to perform a process of forming a thin film containing a predetermined element, boron, carbon, and nitrogen on a substrate in a process chamber by performing a cycle a predetermined number of times, the cycle comprising:

forming a first layer containing boron and a halogen group by supplying a first precursor gas containing boron and the halogen group to the substrate;

forming a second layer containing the predetermined element, boron, carbon, and nitrogen by supplying a second precursor gas containing the predetermined element and an amino group to the substrate and modifying the first layer; and supplying a reaction gas to the substrate, the reaction gas being different from the first precursor gas and the second precursor gas.

* * * * *